US006587348B2

United States Patent
Kondo

(10) Patent No.: US 6,587,348 B2
(45) Date of Patent: Jul. 1, 2003

(54) CONTAINER CASE FOR CARD TYPE DEVICE, CONTAINER CASE HOLDER, AND ELECTRONIC DEVICE USING SUCH CARD TYPE DEVICE

(75) Inventor: Shinichi Kondo, Miyagi (JP)

(73) Assignee: Sony Corporation (JP)

( * ) Notice: Subject to any disclaimer, the term of this patent is extended or adjusted under 35 U.S.C. 154(b) by 29 days.

(21) Appl. No.: 09/838,381

(22) Filed: Apr. 20, 2001

(65) Prior Publication Data

US 2002/0001181 A1 Jan. 3, 2002

(30) Foreign Application Priority Data

Apr. 21, 2000 (JP) .......................... 2000-126323

(51) Int. Cl.[7] .............................. H05K 1/14; H05K 7/00; H05K 7/14; H05K 7/18
(52) U.S. Cl. ........................ 361/741; 361/728; 361/729; 361/730; 361/731; 361/740; 361/747; 361/754; 361/755; 361/756; 361/759; 361/801; 361/802; 439/923; 439/376; 439/328; 439/382
(58) Field of Search ................................. 361/801, 802, 361/726, 728, 729, 730–732, 735–736, 740, 741, 747, 754–756, 759, 752, 685, 737, 785, 790; 312/223.1, 223.2; 211/41.17, 26.2; 439/923, 152, 155, 159, 377, 374, 376, 328, 357, 382

(56) References Cited

U.S. PATENT DOCUMENTS 4,898,540 A * 2/1990 Saito .......................... 439/153
5,674,080 A * 10/1997 Takemura .................... 439/159

* cited by examiner

Primary Examiner—David Martin
Assistant Examiner—Phuong T. Vu
(74) Attorney, Agent, or Firm—Rader, Fishman & Grauer PLLC; Ronald R. Kananen

(57) ABSTRACT

A container case for a card type memory comprises a storage space having an inserting entrance for inserting the card type memory, a resilient engaging pawl provided inside of the storage space for engaging with the card type memory, a leaf spring for ejecting the card type memory out of the storage space by resilient power, and a rotation supporting projection provided inside of the storage space for rotating the card type memory at said rotation supporting projection in the storage space to be easily ejected from the storage space with a comfortable mechanical feeling.

13 Claims, 25 Drawing Sheets

CONTAINER CASE FOR CARD TYPE DEVICE, CONTAINER CASE HOLDER, AND ELECTRONIC DEVICE USING SUCH CARD TYPE DEVICE

BACKGROUND OF THE INVENTION

1. Field of the Invention

This invention relates to a container case for a card type recording medium to be used in an electronic device such as personal computer or an electronic digital camera. This invention further relates to a container case holder for such container case of a card type recording medium, and an electronic device using such card type recording medium.

2. Description of the Related Art

As well known, a card type device such as card type recording medium includes a memory card of a PCMCIA (Personal Computer Memory Card International Association) technical standard, a Smart Media (Registered Trademark of Toshiba Corporation), a Compact Flash (Registered Trademark of U.S.A. SanDisk Corporation), a Memory Stick (Registered Trademark of Sony Corporation) or the like, and such card type recording medium is carried with electronic devices such as a personal computer or an electronic digital still camera in order to record or reproduce audio, video and/or text data to or from a semiconductor memory circuit packed in such card type recording medium. Conventionally such card type recording medium is carried together with an electronic device in an installed condition or the card type recording medium is carried in a pocket of a suit of a user, sometimes. In such case, dust in the pocket is possibly attached to connecting terminals of the card type recording medium, and accordingly these terminals tend to be often stained. Accordingly there causes incomplete connection to the electronic device, and sometimes connecting terminals or the card type recording medium itself tends to be damaged. Accordingly a container case for safely carrying the card type recording medium is conventionally known, such as disclosed in Japanese Non-examined Patent Publications Heisei-6-113915, Heisei-6-253918 and Heisei-7-308216, for example.

FIG. 24 shows one example of such conventional container case for a card type recording medium 100, in which a container case 101 is constituted in the shape of a folding wallet. That is, a plurality of small sized storage sections 103 are formed by sewing or by ultra-sonic welding on an inside of a first peace 101a of the container case 101, wherein one side of each of the small sized storage sections 103 is opened just like a bag, and a large sized storage section 104 is formed by sewing or by ultra-sonic welding on an inside of a second piece 101b of the container case 101, wherein one side of the large sized storage section 104 is also opened just like a bag. The card type recording medium 100 is inserted into or pulled out from a respective one of the small sized storage sections 103 of this container case 101 in a direction of an arrow a or b, and a card 105 such as business card, a cash card or the like is inserted into the large sized storage section 104. The container case 101 can be safely carried in a pocket of a suit in a folded condition.

Further, FIG. 25 shows another example of a conventional container case for the card type recording medium 100. A container case 106 comprises a main body 106a and a case lid 106b and a positioning member 107 made by a foam body and the like, and this positioning member 107 is fixed to the main body 106a by using a double sided adhesion tape (not shown in the figure). The positioning member 107 has a plurality of depression sections 108 each of which is a little bit smaller than an outer size of the card type recording medium 100, and those depression sections 108 are arranged in a lateral direction. Further each of the depression sections 108 has a notch part 109 formed in a semicircle shape as shown in FIG. 25, and each card type recording medium 100 is engaged in flat in each of the depression section 108 utilizing resilience of the foam body of the positioning member 107. The container case 106 is carried in a pocket of a suit with the main body 106a and the case lid 106b closed. When the card type recording medium 100 is taken out from the depression section 108, a finger-tip of a user is inserted to the semi-circled notch part 109 to pick up the card type recording medium 100 out of the depression section 108.

According to these conventional container cases 101, 106 constituted as described above, these container cases 101, 106 can carry more than one card type recording medium 100 at a time. But in the container case 101 as shown in FIG. 24, the card type recording medium 100 is inserted into the storage section 103 or is drawn from the storage section 103 by a finger-tip of a user. Further in the container case 106 as shown in FIG. 25, the card type recording medium 100 is squeezed into the depression section 108 or is pulled up merely by a finger-tip. Accordingly in the conventional container cases 101, 106, it is hard to recognize a mechanical feeling upon insertion and ejection of the card type recording medium 100 to and from the container case 101, 106, and if the container cases are opened unintentionally, the card type recording medium 100 may drop out from the container case 101, 106 by accident. The card type recording medium 100 may be destroyed by this drop at the worst case. In this way, the conventional container cases 101, 106 do not fit a merchandizing image of the card type recording medium 100 commercialized using very advanced technique. In addition, the degree of user satisfaction is low when taking into account that the selling price of this card type recording medium 100 is relatively expensive.

SUMMARY OF THE INVENTION

Accordingly an object of this invention is to present a new container case, a new container case holder and an electronic device or appliance using a card type device such as card type recording medium. The container case of the present invention gives a comfortable mechanical feeling to a user upon insertion and ejection of the card type recording medium, and in particular the reliability in the storing status of the card type recording medium is high and such operation for insertion and ejection can be done with one touch.

The container case for the card type recording medium of the present invention is provided with a resilient engaging means located at one side of a storage space for the card type recording medium, wherein the resilient engaging means is resiliently engaged with a depression section formed at one side and at a leading edge side of the card type recording medium inserted from an inserting entrance. Further, a resilient ejecting means is provided at a bottom of the storage space, wherein an ejecting power is charged in the resilient ejecting means by inserting and pushing the resilient ejecting means at the leading edge of the card type recording medium against the resilient ejecting means. In addition, according to the container case of the present invention, a rotation supporting section is provided at the one side of the storage space and at a shifted location toward the inserting entrance side from the resilient engaging means in the storage space of the container case, wherein the depression section of the card type recording medium is left from the resilient engaging means by pushing the other end section of the card type recording medium and rotating the card type recording medium at the rotation supporting section.

As described above, the container case for the card type recording medium of this invention gives a comfortable mechanical click feeling to a user when the card type recording medium is inserted in the storage space from the inserting entrance, and the resilient engaging means is resiliently engaged with the depression section provided at one side of the card type recording medium. And the resilient ejecting means charges the ejecting power by pushing the resilient ejecting means against the resilience by the leading edge of the card type recording medium. When the card type recording medium is pulled out from the inserting entrance, the other side of the end of the card type recording medium is lightly pushed with a finger of a user to turn, then the card type recording medium turns in a seesaw-like movement on the rotation supporting section, and the depression section is separated from the resilient engaging means. The card type recording medium is then automatically ejected with a pop-up motion from the inserting entrance by the ejecting power charged in the resilient ejecting means.

DETAILED DESCRIPTION OF THE INVENTION

A container case for a card type recording medium, a container case holder and an electronic device using such card type recording medium are explained with reference to FIG. 1 to FIG. 23 inclusive, in detail as follows.

Figure 7A:
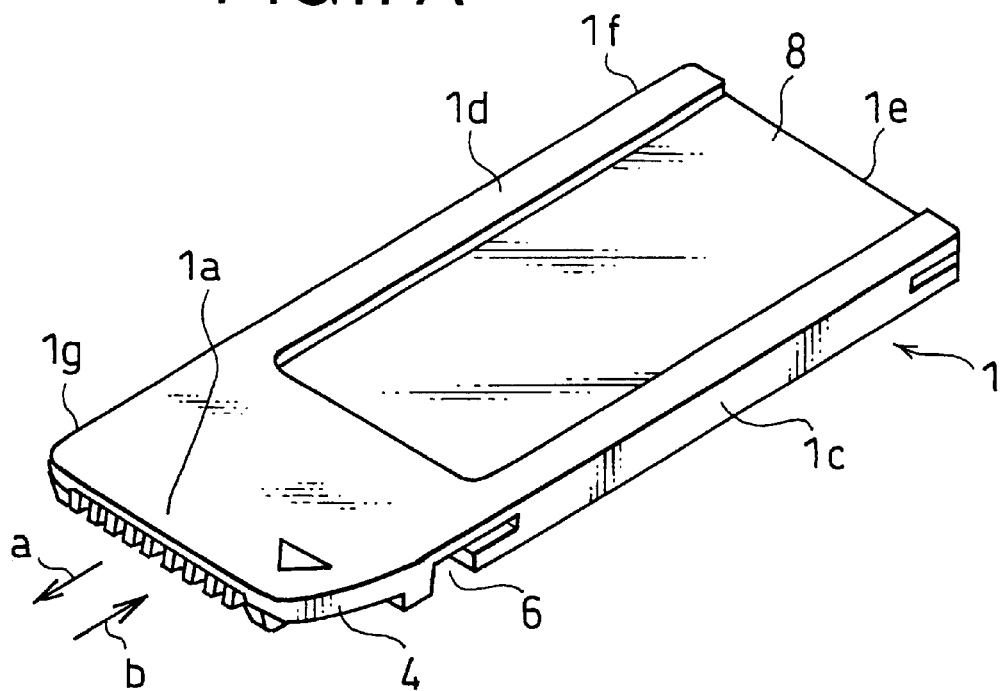
FIGS. 7A and 7B are perspective views for showing a top view and a bottom view of the card type recording medium to be used in the present invention.
Figure 7B:
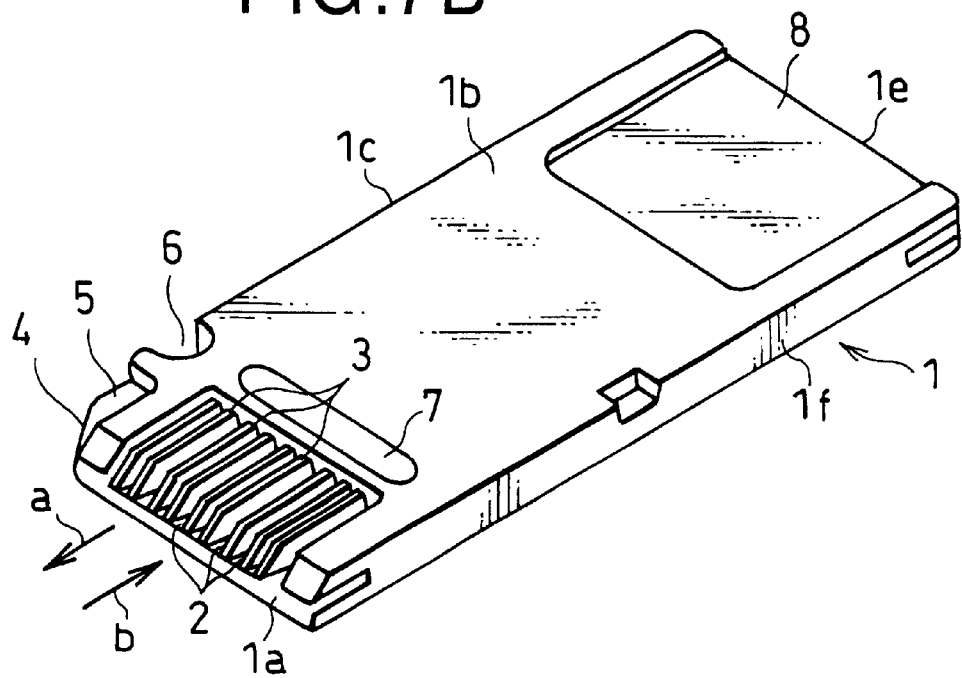

At first, one example of a card type recording medium is explained with reference to FIG. 7A and FIG. 7B. A card type recording medium 1 such as a Memory Stick in this case has a rectangular flat shape that is similar to a chewing gum shape, and almost a shape of a card. A plurality of comb-shaped terminals 2 are arranged at a bottom surface 1*b* and a leading edge 1*a* of this card type recording medium 1 by spacing in directions orthogonal to arrows a and b which are inserting and ejecting directions to and from an electronic device. There is provided a plurality of thin ribs 3 between the comb-shaped terminals 2 for partitioning. The most right and most left terminals of the terminals 2 constitute earth terminals, and the other of the terminals 2 constitute signal terminals. And an R face 4 for preventing erroneous insertion is provided at the leading edge 1*a* of a left side 1*c*, viewing from the inserting direction (the direction of the arrow a), of this card type recording medium 1.

Further a step portion 5 for preventing erroneous insertion is formed at the leading edge 1a of the bottom surface 1b corresponding to a location of the R face 4 of this card type recording medium 1. At a lower part of this card type recording medium 1, a depression section 6 having a semi-circle shape for lock is formed at the left side 1c and near the leading edge 1a. A write protector 7 is provided at the bottom surface 1b and at a location near the leading edge 1a of this card type recording medium 1. Further a label attaching area 8 is formed as a shallow depression so as to include an end edge 1e at a top surface 1d and the bottom surface 1b of this card type recording medium 1.

Next a first embodiment of a container case of the present invention is explained with reference to FIG. 1 to FIG. 6. A container case 11 comprises a main body 12 which is formed with synthetic resin such as ABS resin (a copolymer of Acrylonitrile, Butadiene and Styrene), polyacetal or polypropylene, and a lid body 13 is constituted by seat materials formed of synthetic resin such as polypropylene, polyethylene, terephthalate or polystyrene. The container case 11 is formed in a flat shape as shown in FIGS. 1 to 6. A flat shaped storage space 14 and a top side 12a of the main body 12 and an inserting entrance 15 opened at an upper end of the storage space 14 are covered with the lid body 13. A bottom part 16 of the storage space 14 is closed and a stopper wall 16a is integrally formed at the most bottom position of the bottom part 16. This stopper wall 16a has a linear face and an R face which are parallel to the leading edge 1a and the R face 4 of the card type recording medium 1. In this case, four pins 17 are provided at the top surface 12a of four corners of the main body 12, and four holes 18 are provided at four corners of the lid body 13 corresponding to the four pins 17. The lid body 13 is fixed to the top surface 12a of the main body 12 by welding four leading edges of the pins 17. Alternatively, the lid body 13 is fixed to the top surface 12a of the main body 12 by adhering with glue or a double sided tape.

Figure 5:
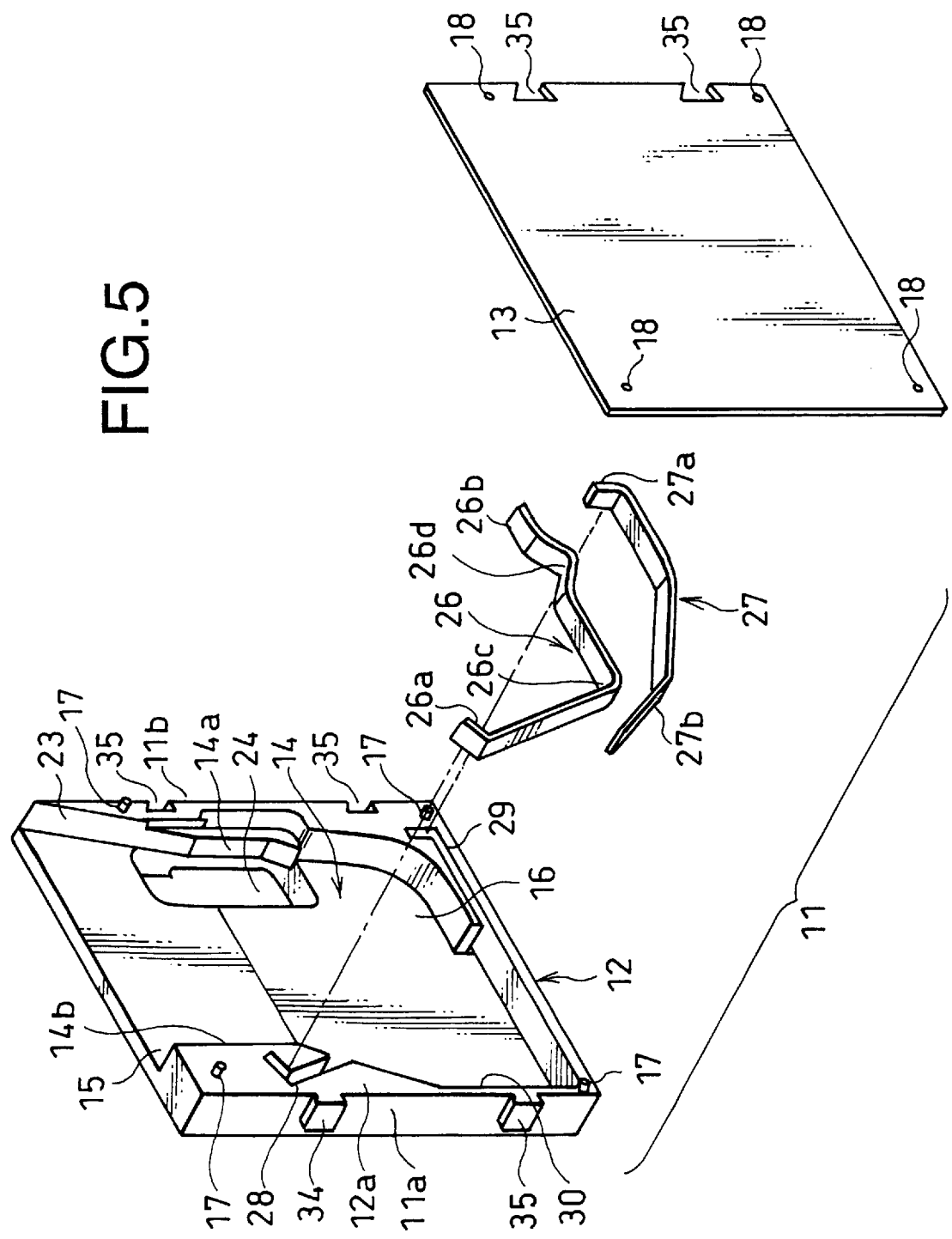
FIG. 5 is a perspective view for explaining the first embodiment of the container case for the card type recording medium, wherein the container case is disassembled.
Figure 6:
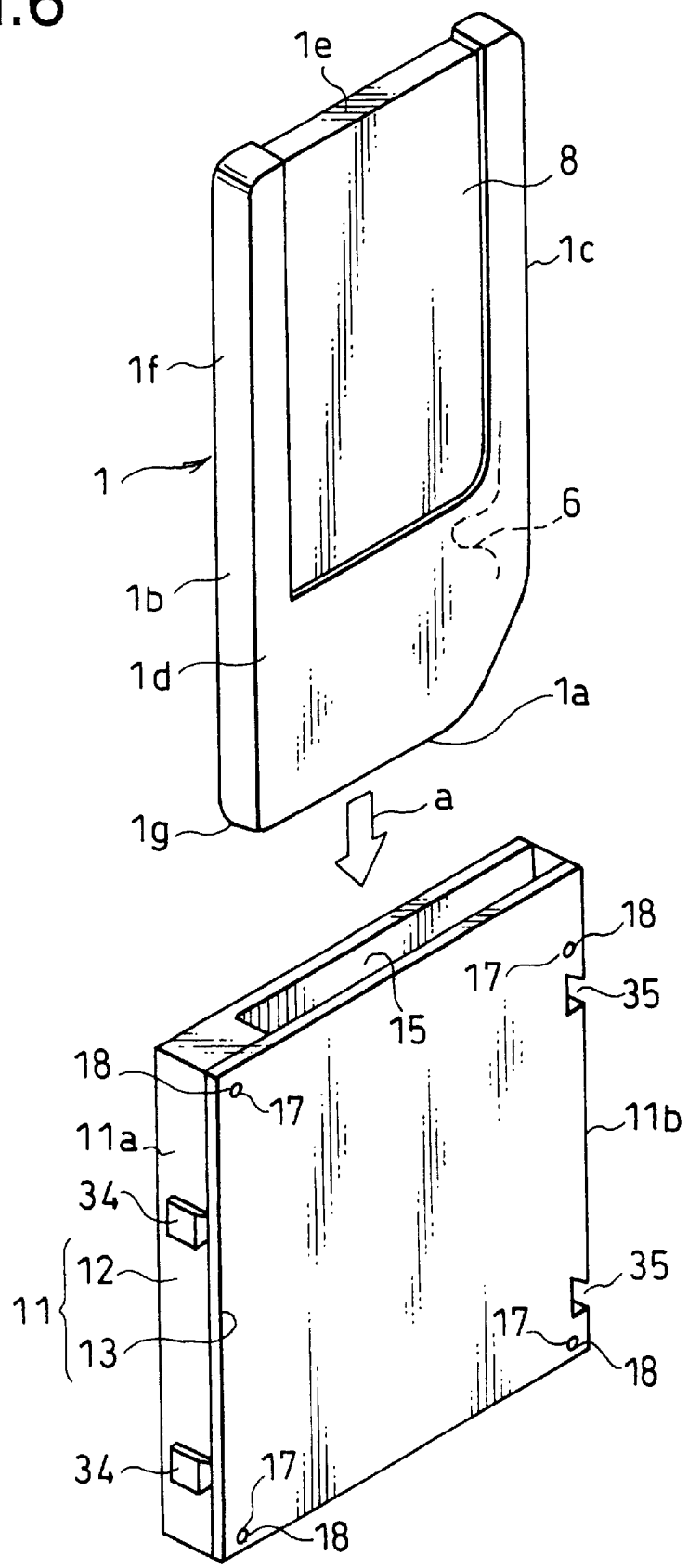
FIG. 6 is a perspective view for explaining an assembled status of the first embodiment of the container case and the card type recording medium.

A resilient engaging pawl 21 constituting a resilient engaging means is integrally formed with the main body 12 at a central part of a one side portion 14a of the storage space 14 and at a location shifted toward the arrow a direction which is the inserting direction of the card type recording medium 1. Further a rotation supporting section 22 for the card type recording medium 1 and a triangle space which forms a depression 23 for escape for the card type recording medium 1 are integrally formed at the one side portion 14a of the storage space 14 and at a position shifted toward the inserting entrance 15 from the resilient engaging pawl 21. A hole 24 for undercut to integrally form the resilient engaging pawl 21 is formed at a position corresponding to a back face for the resilient engaging pawl 21 of the main body 12 as shown in FIG. 5, and such hole 24 can be sealed with seal material.

A first leaf spring 26 and a second leaf spring 27 together constituting a resilient ejecting means are attached at the bottom part 16 of this storage space 14. These first and second leaf springs 26, 27 are fixed to the main body 12 by pressing L-shaped fixing ends 26a, 27a engaging with L-shaped stopper holders 28, 29 integrally formed on the main body 12 by the lid body 13 fixed to the top surface 12a of the main body 12.

Figure 1:
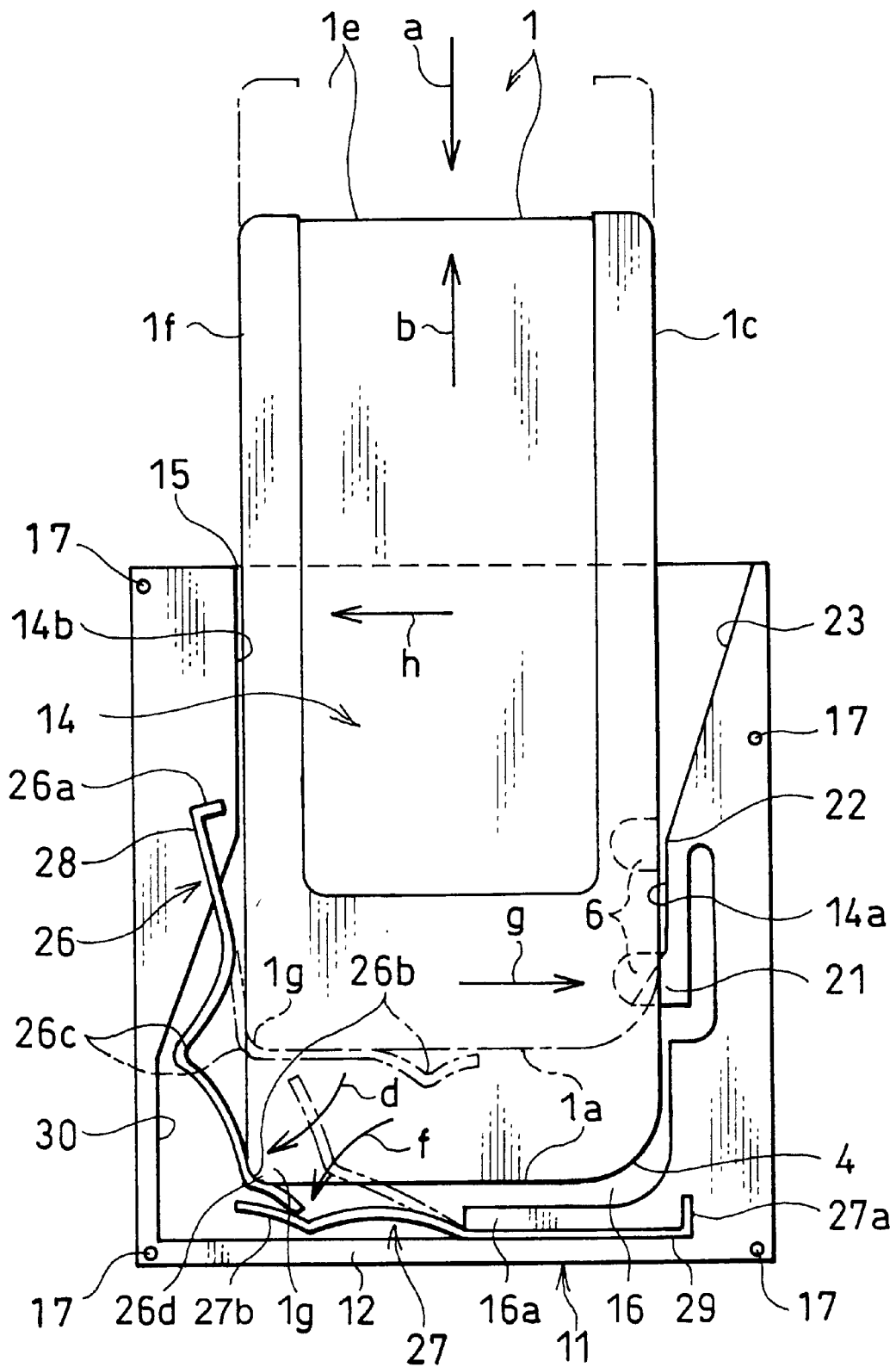
FIG. 1 is a top view for explaining a first embodiment of a container case of the present invention where a card type recording medium is about to be inserted into a storage space of a container case of this first embodiment, wherein a lid body of the container case is removed.

The fixing end 26a of the first leaf spring 26 is fixed at the side 14b of the storage space 14 and at a location shifted toward the inserting entrance 15. The moving end 26b elongated diagonal to the bottom part 16 of the leaf spring 26 is bent in a shape of L. And further a first right-angled bending section 26c formed at a middle part of the leaf spring 26 and a second right-angled bending section 26d formed at a predetermined space from a tip of the moving end 26b are provided at the leaf spring 26. This moving end 26b of the leaf spring 26 is formed to be able to resiliently move in a direction of arrows c and d. This first leaf spring 26 is constituted as a resilient leaf spring to push the leading edge 1a of the card type recording medium 1 toward an arrow g direction as shown in FIG. 1, namely toward the one side 14a of the storage space 14.

Figure 3:
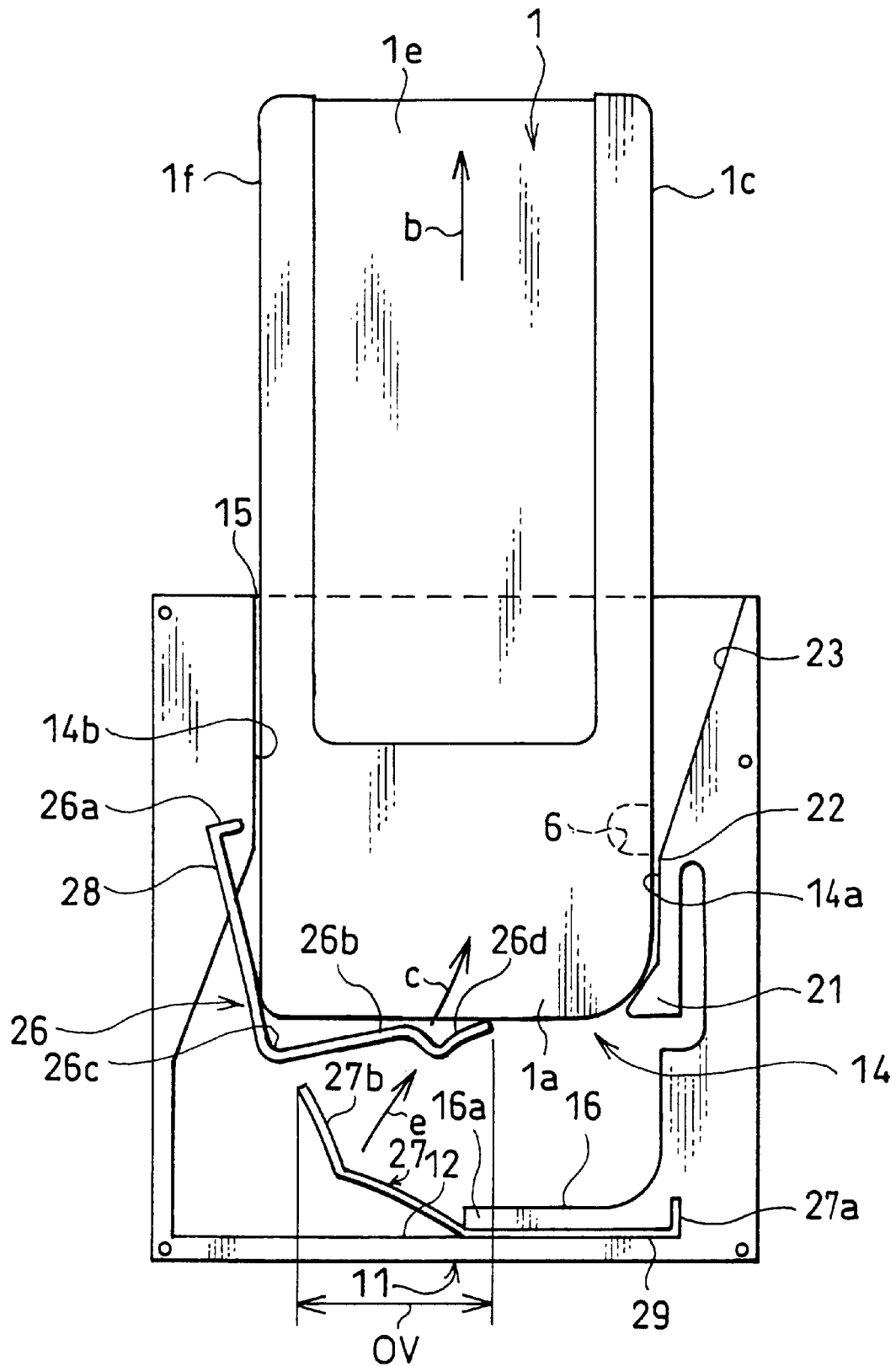
FIG. 3 is a top view for explaining the first embodiment of the present invention where the card type recording medium is ejected from the storage space of this container case of the first embodiment, wherein the lid body of the container case is removed.
Figure 4:
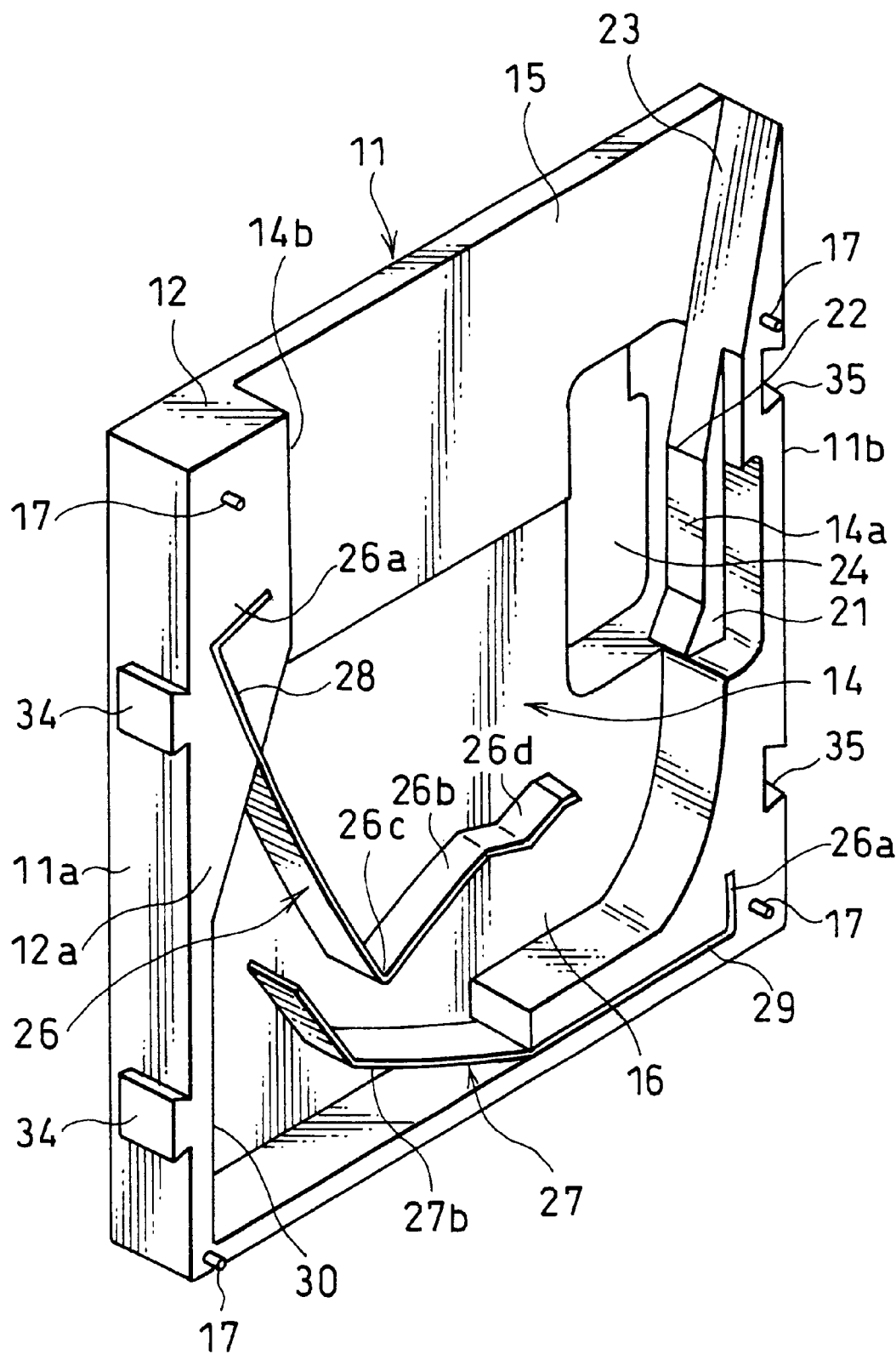
FIG. 4 is a perspective view of a main body of the container case for explaining the first embodiment, wherein the lid body of the container case is removed.

The fixing end 27a of the second leaf spring 27 is fixed at a location shifted toward the side portion 14a of the bottom part 16 of the storage space 14. A moving end 27b of this second leaf spring 27 is elongated toward the other side 14b and toward the inserting entrance 15 from the stopper wall 16a of the bottom part 16 in the storage space 14. The moving end 27b of the second leaf spring 27 is bent into a wide-angled V shape. Further the moving end 27b of the second leaf spring 27 is elongated to a location where the moving end 27b and the moving end 26b of the first leaf spring 26 are overlapped with each other at an overlapping position OV as shown in FIG. 3. The moving end 27b of the second leaf spring 27 is formed to be able to resiliently move in the directions of arrows e and f. The second leaf spring 27 is formed as a leaf spring to be used to resiliently push the leading edge 1a of the card type recording medium 1 for ejecting operation toward the arrow b direction, namely toward the ejecting direction. A depression 30 is provided at the side 14b and the bottom part 16 of the storage space 14 for escaping the moving end 26b of the first leaf spring 26 and the moving end 27b of the second leaf spring 27. As for the first and second leaf springs 26 and 27, these leaf springs may be integrally formed with the main body 12 as leaf springs made of synthetic resin.

The first embodiment of this container case 11 comprises the structure as above described, and inserting and ejecting operation of the card type recording medium 1 to the container case 11 are done in the following manner. At first, in a status before inserting the card type recording medium 1 in the container case 11, the moving ends 26b, 27b of the first and second leaf springs 26, 27 are shifted to locations as shown in FIG. 3 by resilient power of them to an arrow c and e direction.

When inserting the card type recording medium 1 to the container case 11, the end edge 1e of the card type recording medium 1 is pushed by a finger-tip of an user. Then the card type recording medium 1 is inserted through the inserting entrance 15 from the leading edge 1a into the storage space 14 as for the bottom surface 1b of the card type recording medium 1 to be facing toward the main body 12 and for the top face 1d to be facing to the lid body 13 (a correct direction). And when the card type recording medium 1 is inserted into the storage space 14 in an arrow a direction to the position shown with one dot chain line as shown in FIG. 1, a corner part 1g positioned between the leading edge 1a and a right side 1f of the card type recording medium 1 is contacted at first to the first right-angled bending section 26c of the moving end 26b of the first leaf spring 26.

When the card type recording medium 1 is successively inserted from the leading edge 1a to the arrow a direction toward the bottom part 16 of the storage space 14 as shown in FIG. 1 with a solid line, the moving end 26b of the first leaf spring 26 is bent against the resilient power by the corner part 1g near the leading edge 1a of the card type recording medium 1 in an arrow d direction. In this case, a lateral resilient pressure toward an arrow g direction acts on the leading edge 1a of the card type recording medium 1 by the resilient power of the moving end 26b. Further this time, a leading edge of the moving end 26b of the first leaf spring 26 is contacted to a leading edge of the moving end 27b of the second leaf spring 27, and accordingly the moving end 27b is also bent toward an arrow f direction against the resilient power, too. And the moving end 27b of the second leaf spring 27 acts as a resilient power on the leading edge 1a of the card type recording medium 1 in an arrow b direction by way of the leading edge of the moving end 26b of the first leaf spring 26. And accordingly an ejecting power in an arrow b direction for the card type recording medium 1 can be charged in the first and second leaf springs 26, 27.

And as shown in FIG. 1 with a solid line, when the leading edge 1a of the card type recording medium 1 is completely inserted in an arrow a direction to a regular position in the storage space 14, the resilient engaging pawl 21 is dropped to the depression section 6 of the card type recording medium 1 for the resilient engagement, and an user can feel a comfortable click feeling at this time. And simultaneously with the timing when the resilient engaging pawl 21 is engaged with the depression section 6, the corner part 1g at the leading edge 1a of the card type recording medium 1 is also stably fallen into the second right-angled bending section 26d of the moving end 26b in the first leaf spring 26. When the corner part 1g at the leading edge 1a of the card type recording medium 1 is fallen into the second right-angled bending section 26d of the moving end 26b in the first leaf spring 26, the leading edge 1a of the card type recording medium 1 receives a lateral pressure of an arrow g direction and an ejecting power of an arrow b direction, and thereby the depression section 6 of the card type recording medium 1 is deeply engaged in the arrow g direction with the resilient engaging pawl 21, and the ejection to the arrow b direction of the card type recording medium 1 is prohibited by the resilient engaging pawl 21. Furthermore, the side 14b of the storage space 14 is pushed against the right side If of the card type recording medium 1 by a reaction power of an arrow h direction occurring by the lateral pressure to the arrow g direction, and thereby the card type recording medium 1 is stably locked in the storage space 14. And in this condition, almost all length of the card type recording medium 1 is received in the storage space 14, and only a part of the end edge 1e is projected from the inserting entrance 15.

In this way by completely inserting the leading edge 1a of the card type recording medium 1 from an arrow a direction to the regular position in the storage space 14, the resilient engaging pawl 21 makes a resilient engagement with the depression section 6 of the card type recording medium 1, and at this time a comfortable click feeling occurs. Accordingly the user will know when complete insertion of the card type recording medium 1 to the storage space 14 has occurred by such mechanical feeling of the click, and the user can use the card type recording medium 1 with such click feeling without an anxiety of failure of installation. And in the completion status of the installation, the resilient engaging pawl 21 is deeply engaged with the depression section 6 of the card type recording medium 1, and does firmly lock the card type recording medium 1, so that there is no fear that the card type recording medium 1 will be dropped out from the inserting entrance 15 in the arrow b direction. Even if the end edge 1e of the card type recording medium 1 is erroneously tried to be pulled in the arrow b direction by a finger-tip in this storage status, the card type recording medium 1 is never pulled out and the card type recording medium 1 is firmly locked in the storage space 14 safely, and high reliability of the storage status of the card type recording medium 1 is obtained.

Figure 2:
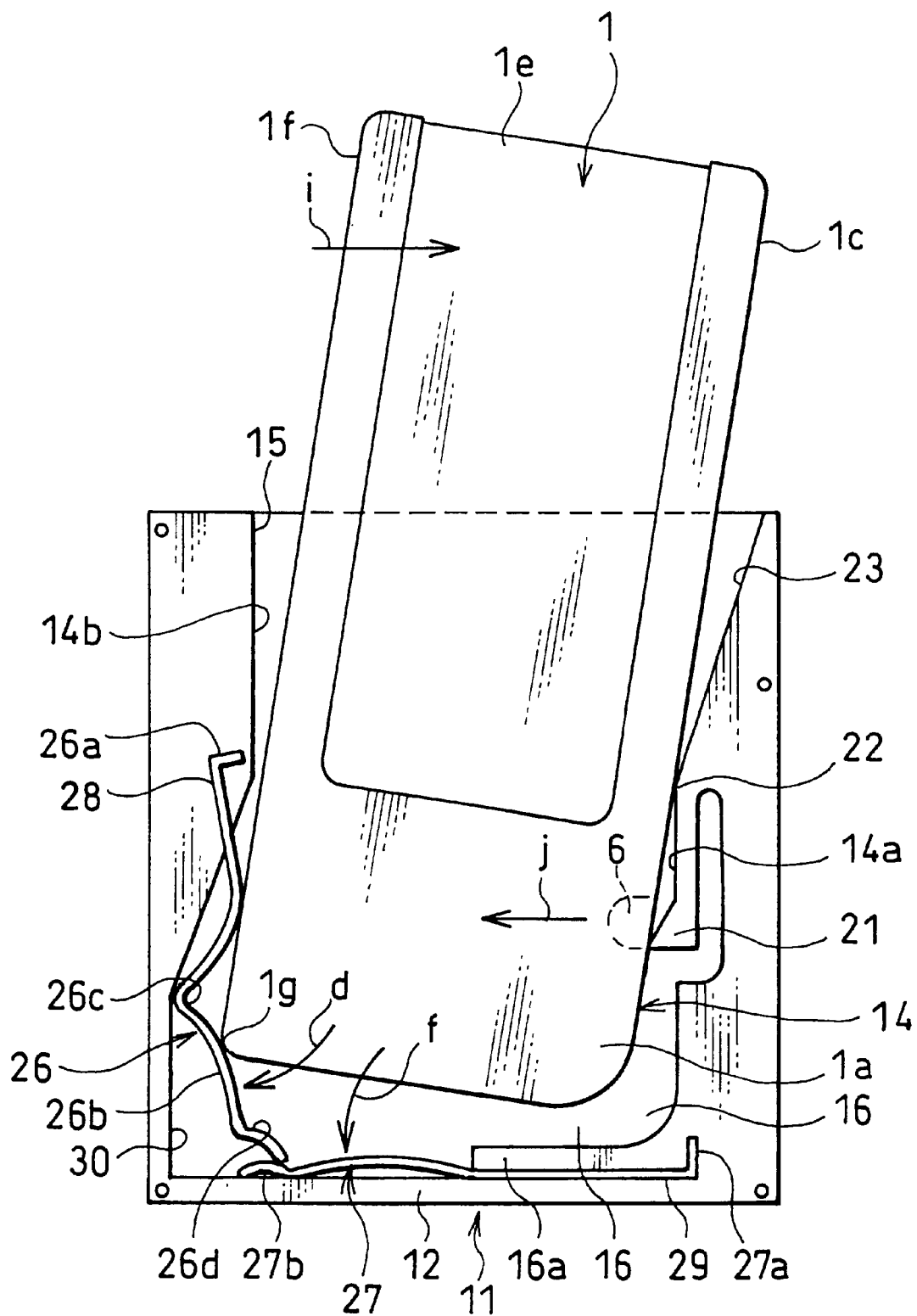
FIG. 2 is a top view for explaining the first embodiment of the present invention where the card type recording medium is about to be ejected from the storage space of this container case of the first embodiment, wherein the lid body of the container case is removed.

When taking out the card type recording medium 1 from the container case 11, the right side if at the end edge 1e of the card type recording medium 1 projecting from the inserting entrance 15 is slightly pushed by a finger-tip in an arrow i direction. Then a central portion of the left side 1c of the card type recording medium 1 as shown in FIG. 2 is rotated around the rotation supporting section 22 in arrow i and j directions like a seesaw. Then the leading edge 1a of the card type recording medium 1 turns to the arrow j direction in the storage space 14, and the depression section 6 is disengaged with the resilient engaging pawl 21 in the arrow j direction.

And immediately after releasing the finger-tip, which is pushing the right side if of the end edge 1e of the card type recording medium 1 in an arrow i direction as shown in FIG. 2, from the right side 1f of the card type recording medium 1, the moving ends 26b, 27b of the first and the second springs 26, 27 are resiliently returned in the arrow c, e directions by the spring power as shown in FIG. 3 and the card type recording medium 1 is ejected with a pop-up motion in the arrow b direction from the storage space 14. Therefore the user is only to push the right side 1f of the end edge 1e of the card type recording medium 1 to the arrow i direction lightly by the finger-tip, then the card type recording medium 1 is automatically jumped out with a pop-up motion from the storage space 14 to the arrow b direction. Then the user can pick up the end edge 1e of the card type recording medium 1 in order to take out the card type recording medium 1 from the container case 11, and handling operation of the card type recording medium 1 becomes very convenient.

Next a second embodiment of a container case of the present invention is explained with reference to FIG. 8. A container case 11 of this embodiment is provided with a third spring 32 as a resilient pushing means in the position located at the side 14a of the storage space 14 and at a position shifted from the rotation supporting section 22 toward the inserting entrance 15. This third spring 32 may be formed integrally with the main body 12 or may be formed with a leaf spring fixed to the main body 12.

Figure 8:
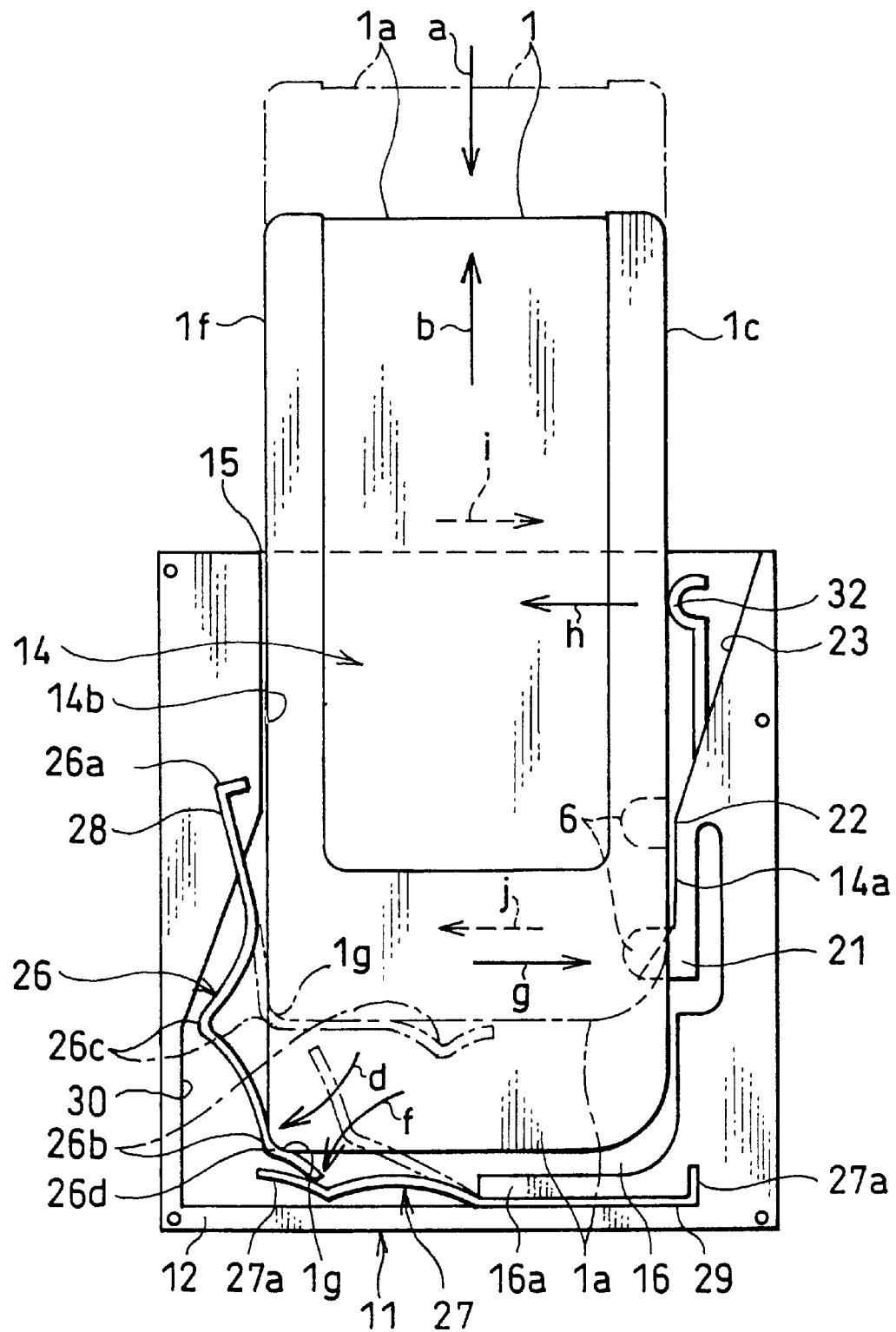
FIG. 8 is a top view for explaining a second embodiment of a container case of the present invention, wherein a lid body of the container case is removed.

When the card type recording medium 1 is inserted into the storage space 14, the left side 1c of the card type recording medium 1 is pressed toward the arrow h direction by the third spring 32 as shown in FIG. 8. Accordingly the card type recording medium 1 can be smoothly inserted into the storage space 14 while the right side 1c of the card type recording medium 1 is resiliently pushed toward the side 14b of the storage space 14, and thereby the card type recording medium 1 is hard to incline to the arrow i direction upon inserting operation. As a result, the resilient engaging pawl 21 is stably engaged with the depression section 6 and the comfortable click feeling occurs upon the engagement of the resilient engaging pawl 21 into the depression section 6. Further the third spring 32 can prevent looseness in the directions of arrows i and j of the card type recording medium 1 in the storage space 14, and the engaging condition of the resilient engaging pawl 21 with the depression section 6 is stably kept, so that it is prevented for the card type recording medium 1 to be undesirably dropped off in the arrow b direction by disengaging the resilient engaging pawl 21 with the depression section 6 by the vibration of the card type recording medium 1 in the arrow i and j directions. In addition when the card type recording medium 1 is ejected out of the inserting entrance 15 in the arrow b direction by pushing the right side if of the end edge 1e of the card type recording medium 1 in the arrow i direction by a finger-tip and disengaging the resilient engaging pawl 21 with the depression section 6, the third spring 32 gives appropriate load to the finger-tip of the user, and the mechanical feeling for the ejecting operation is improved.

Figure 9:
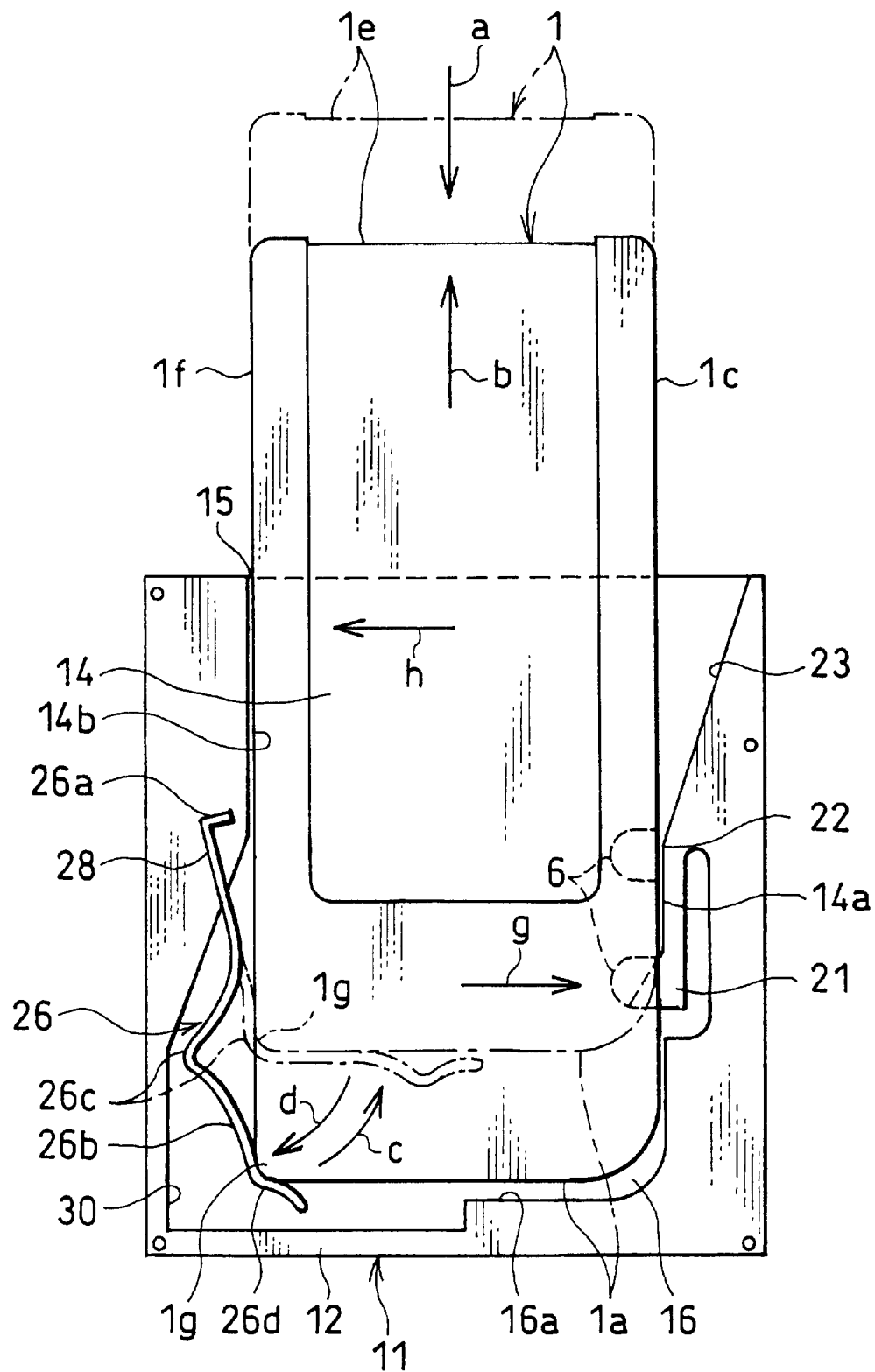
FIG. 9 is a top view for explaining a third embodiment of a container case of the present invention, wherein a lid body of the container case is removed.

Next a third embodiment of a container case of the present invention is explained with reference to FIG. 9. The resilient ejecting means of this container case 11 for ejecting the card type recording medium 1 to the arrow b direction is constituted only by the first leaf spring 26, and accordingly the second leaf spring 27 is omitted in this third embodiment. In this case, in order to omit the second leaf spring 27, the spring power of this first leaf spring 26 is boosted up by making a thickness of the first leaf spring 26 thicker, and thereby the number of components and steps for assembly process of the container case 11 can be reduced to realize a cost reduction.

Figure 10:
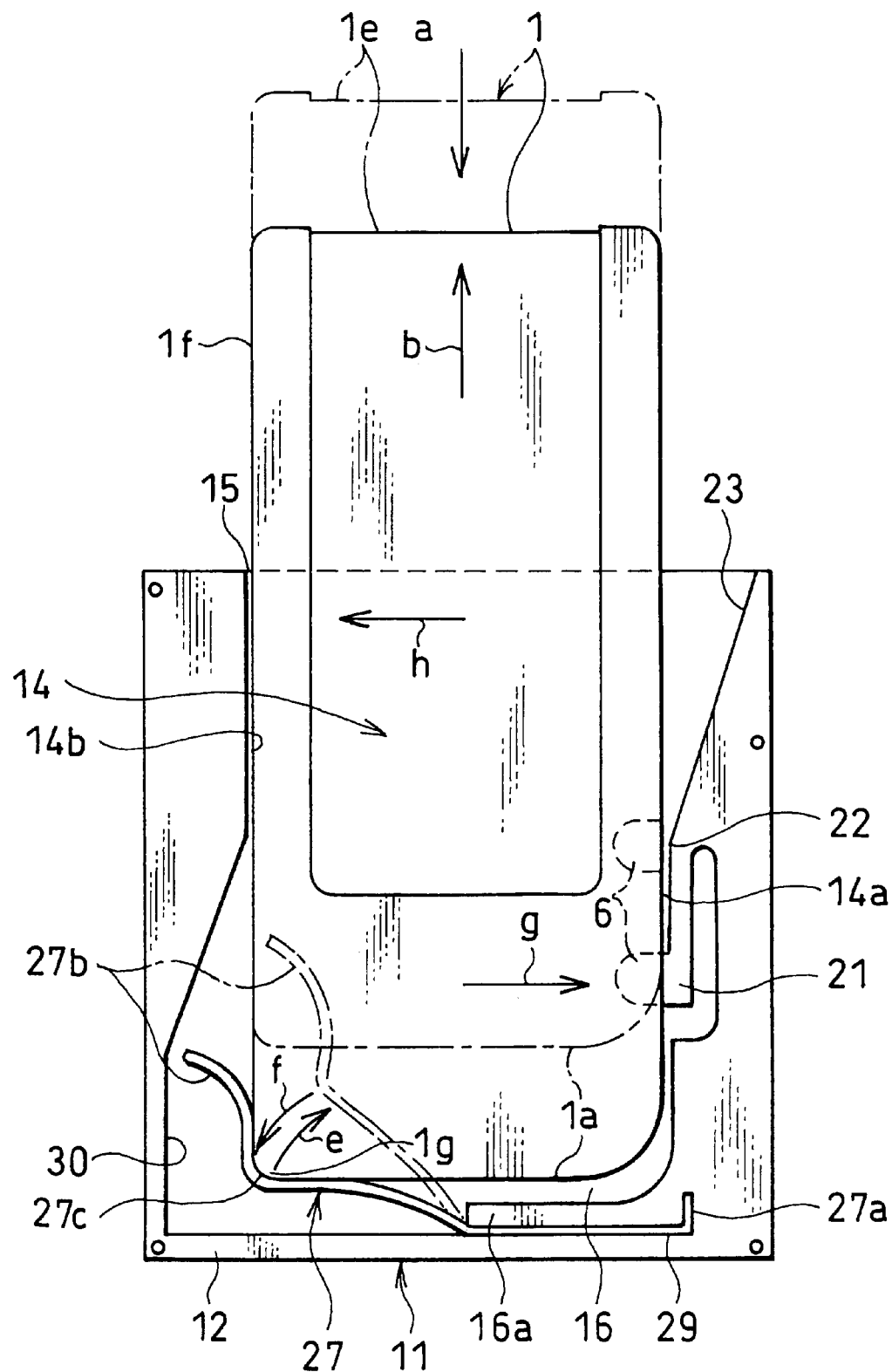
FIG. 10 is a top view for explaining a fourth embodiment of a container case of the present invention, wherein a lid body of the container case is removed.
Figure 11:
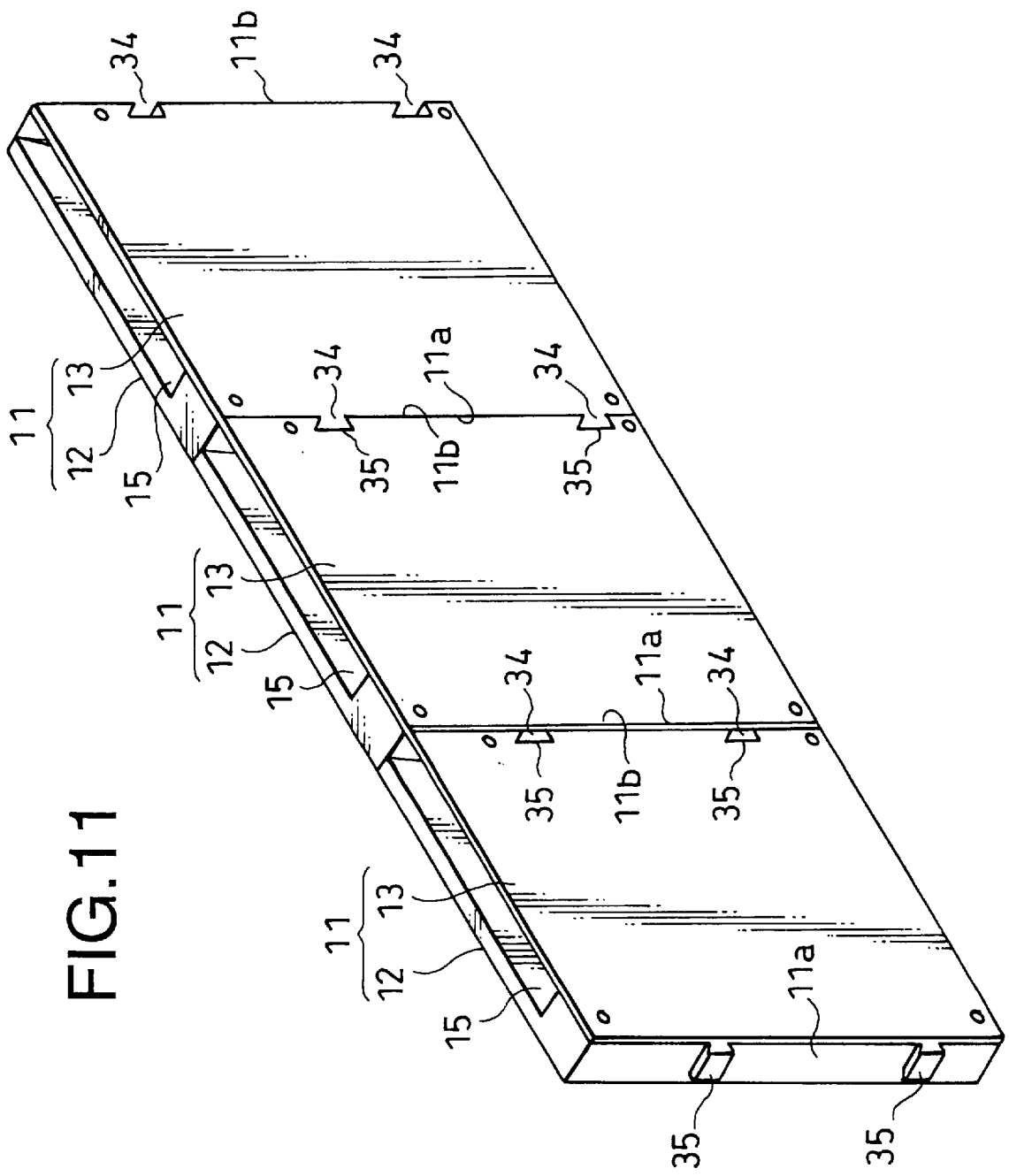
FIG. 11 is a perspective view for explaining a fifth embodiment of a container case of the present invention.

Next a fourth embodiment of a container case of the present invention is explained with reference to FIG. 10. The resilient ejecting means of this container case 11 for ejecting the card type recording medium 1 to the arrow b direction is constituted only by the first leaf spring 27, and the second leaf spring 26 is omitted in this fourth embodiment. In this case, in order to omit the second leaf spring 26, the spring power of this first leaf spring 27 is boosted up by making a thickness of the first leaf spring 27 thicker, and thereby the number of components and steps for assembly process of the container case 11 can be reduced to realize a cost reduction. In addition, a right-angled bending section 22c to be engaged with the corner part 1g of the card type recording medium 1 in this case is preferably formed at a middle part of the moving end 27b of the second leaf spring 27.

Next a fifth embodiment of a container case of the present invention is explained with reference to FIG. 4 to FIG. 6 and FIG. 11. The container case 11 of this embodiment has an engaging means on both a right side surface 11a and a left side surface 11b. Namely the container case 11 has plural projections 34 and plural depressions 35 as a dovetail construction integrally formed with the main body 12, and a plurality of container cases 11 can be detachably connected to each other in the lateral direction as shown in the figure by the engagement of the projections 34 and depressions 35 at the side surfaces 11a and 11b. Thereby the plural container cases 11 of this embodiment can be carried together by connecting in the lateral direction, and the mobility of the container case 11 is improved.

Figure 12:
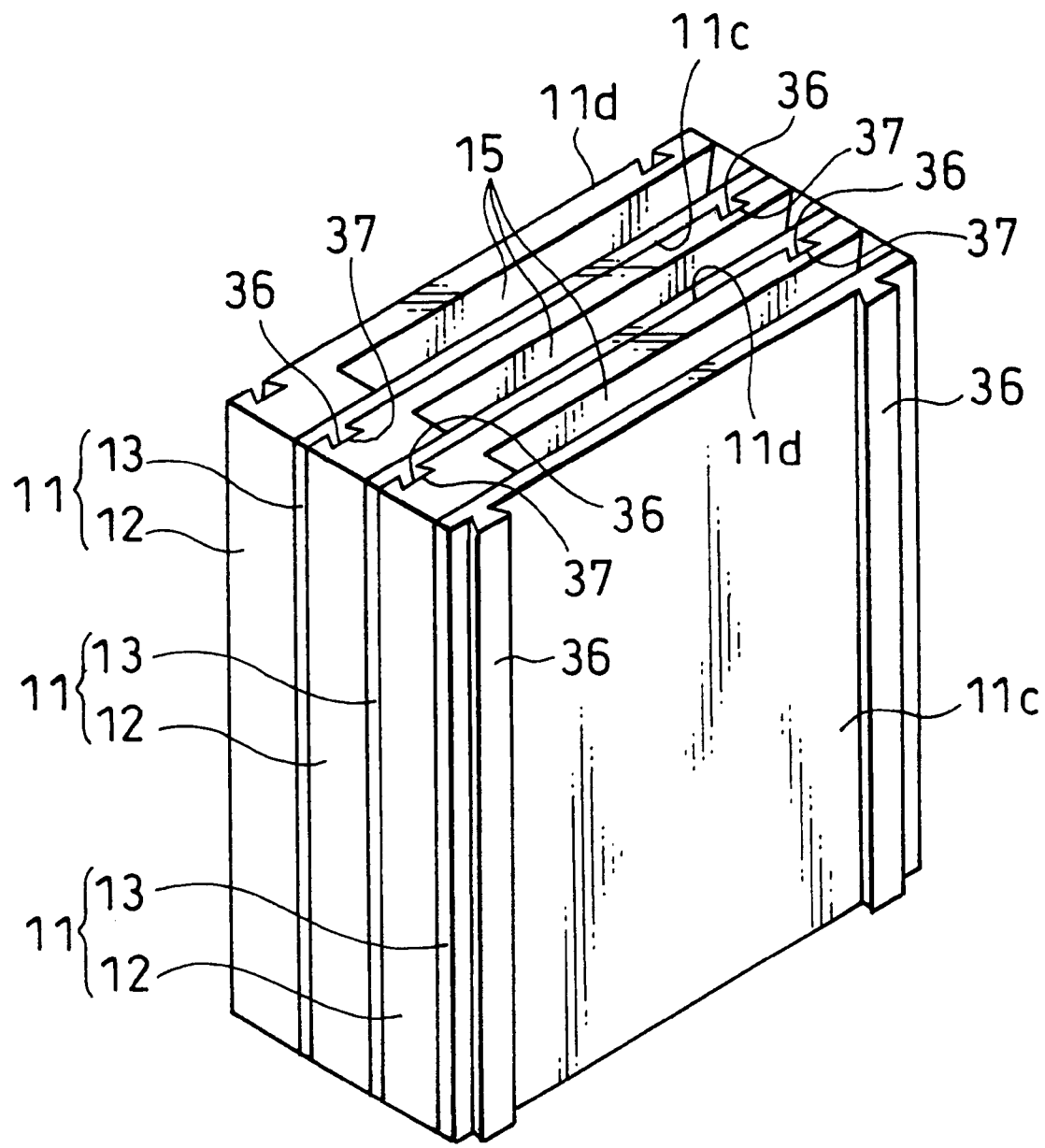
FIG. 12 is a perspective view for explaining the sixth embodiment of a container case for the card type recording medium.
Figure 13:
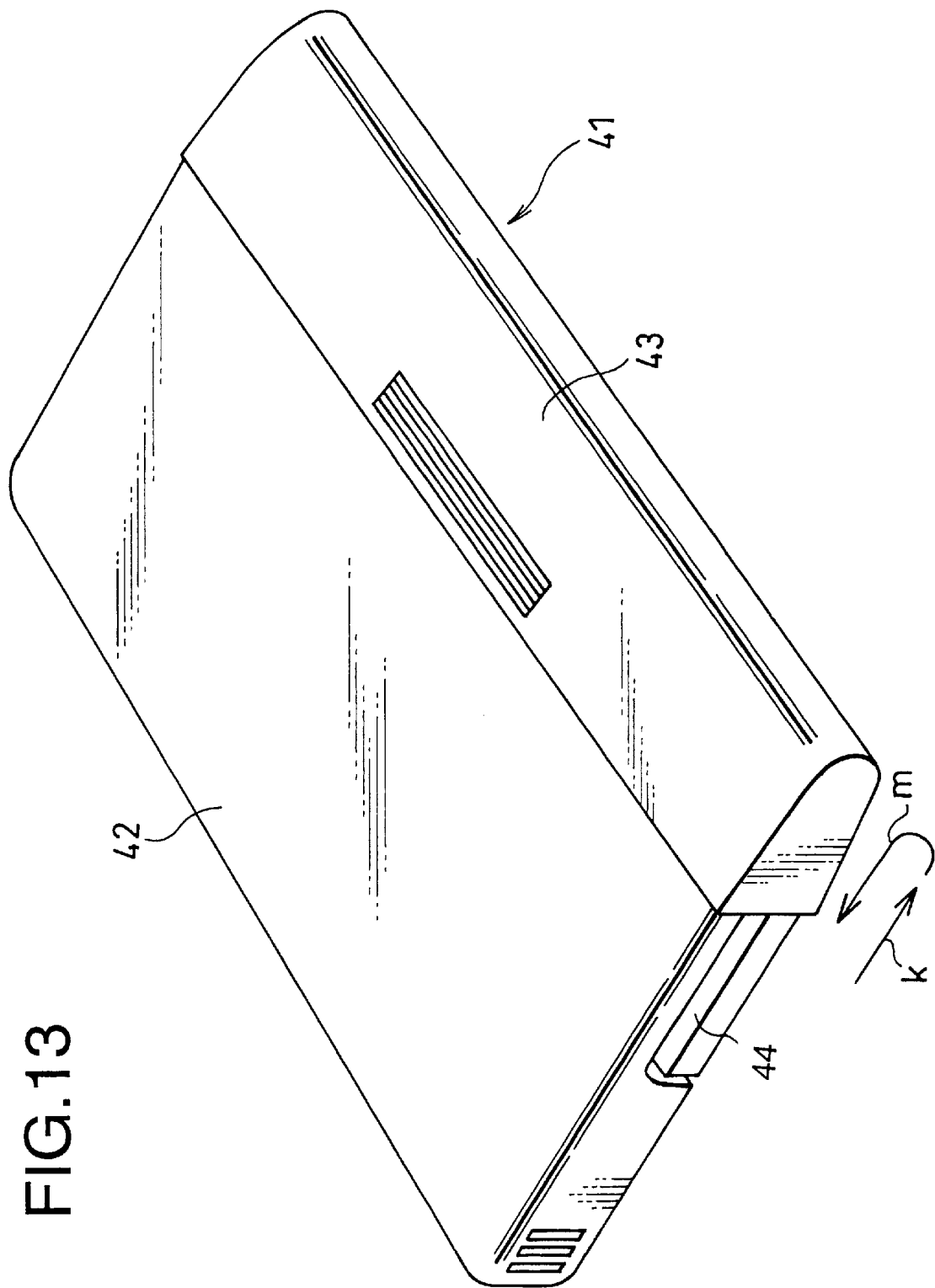
FIG. 13 is a perspective view for explaining a first embodiment of a container case holder for the card type recording medium.
Figure 14:
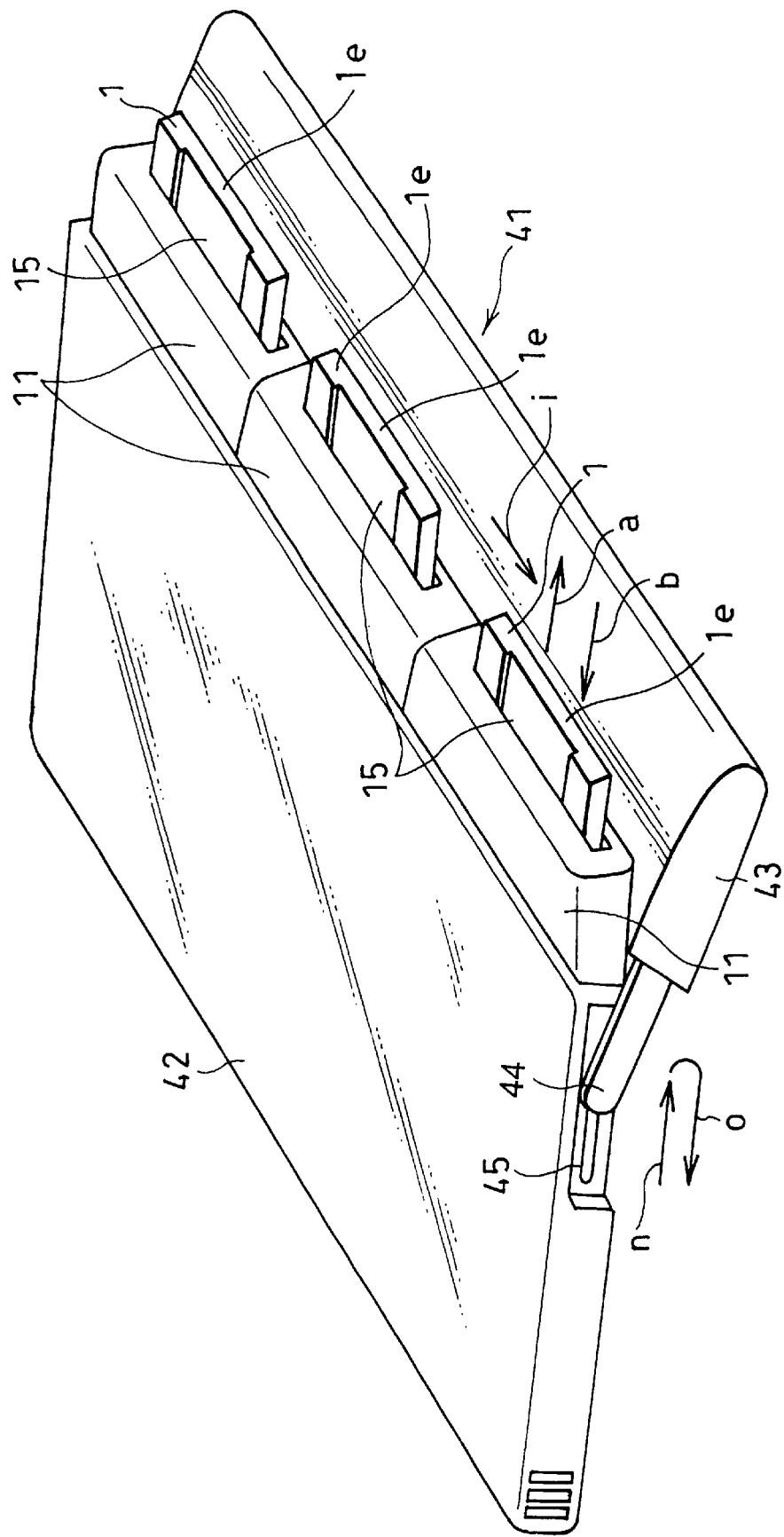
FIG. 14 is a perspective view for explaining insertion and ejection of the card type recording medium to and from the first embodiment of the container case holder of FIG. 13.

Next a sixth embodiment of a container case of the present invention is explained with reference to FIG. 12. This container case 11 of this embodiment has an engaging means on both sides of a front side surface 11c and a back side surface 11d. Namely the container case 11 has plural projections 36 and plural depressions 37 as a dovetail construction integrally formed with the main body 12 and a plurality of container cases 11 can be detachably connected to each other in the stacked direction by the engagement of the projections 36 and depressions 37 at the front and back side surfaces 11c and 11d. Thereby the plural container cases 11 of this embodiment can be carried with together by connecting in the stacked direction and the mobility of the container case 11 is improved Next a first embodiment of a container case holder is explained with reference to FIG. 13 and FIG. 14. For example, a container case holder 41 of this embodiment receives three of the container case 11 as shown in FIG. 1, for example, in a main holder body 42 of a flat shaped and a business card sized, and the end edges 1e and the inserting entrances 15 of the received three card type recording medium 1 are simultaneously opened and/or closed by a cover 43 affixed to the main holder body 42. The cover 43 is engaged with a pair of guide grooves 45 with tips of a pair of arms 44 slidably and rotatably provided at left and right sides of the cover 43, wherein the guide grooves 45 are provided on left and right sides of the main holder body 42. And as shown in FIG. 14, the card type recording medium 1 is stored by inserting in the arrow a direction from the inserting entrance 15 of the container case 11 after the cover 43 is opened. The cover 43 is closed after that in arrows k and m directions, thereby the end edges 1e and the inserting entrances 15 of the received three card type recording medium 1 are simultaneously closed by the cover 43 in order to carry this container case holder 41.

According to the container case holder 41, the mobility and the dust-tight nature to the plural (3 pieces, for example) container case 11 and the card type recording medium 1 are raised and a plurality of the card type recording medium 1 can be safely carried. When the card type recording medium 1 received in each container case 11 is taken out, the cover 43 is opened in arrows n and o directions as shown in FIG. 14. Then the card type recording medium 1 can be automatically pushed out in the arrow b direction from the container case 11 with a pop-up motion by slightly pushing the end edge 1e of the card type recording medium 1 to the arrow i direction as mentioned before.

Figure 15:
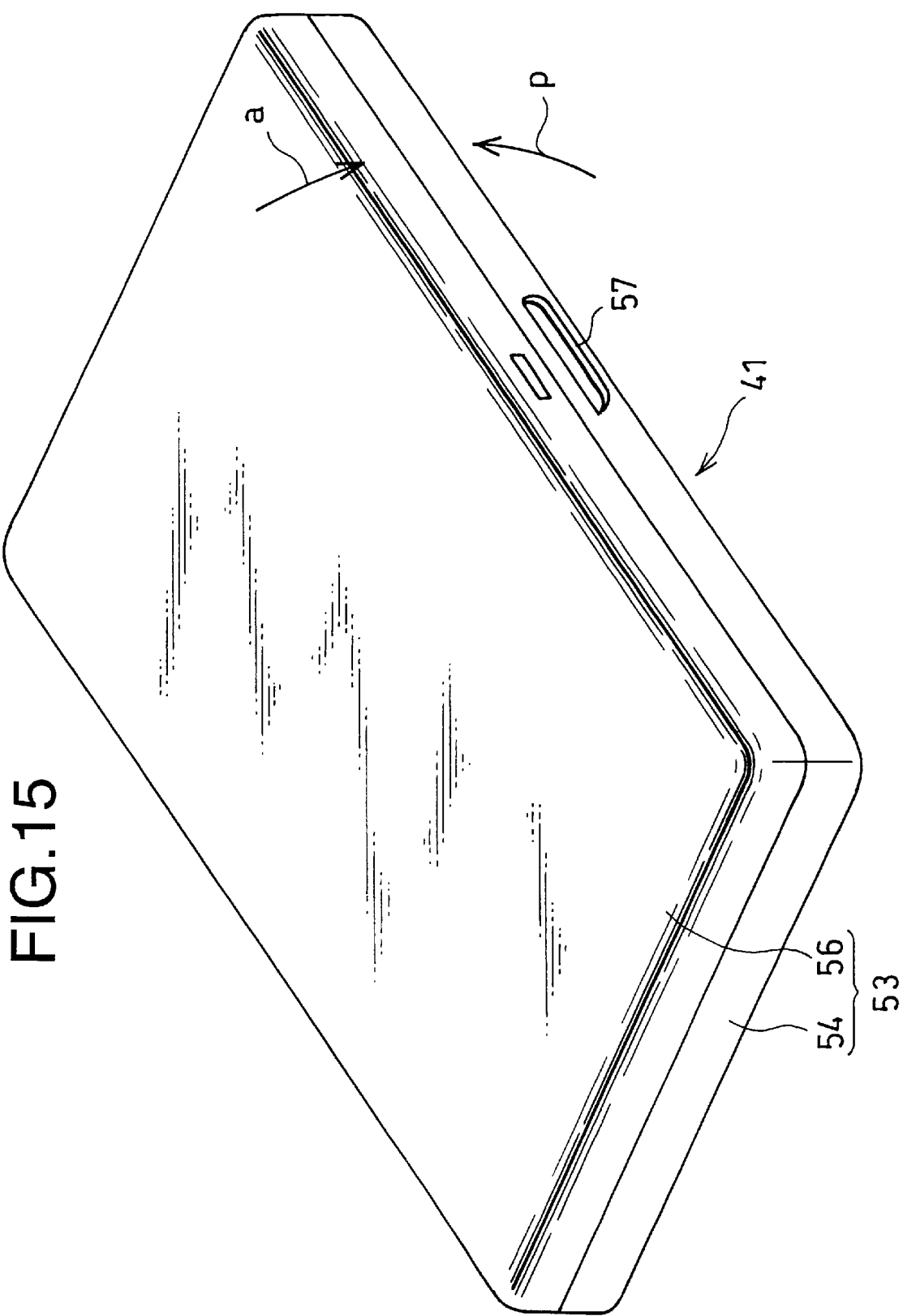
FIG. 15 is a perspective view for explaining a second embodiment of a container case holder for the card type recording medium.
Figure 16:
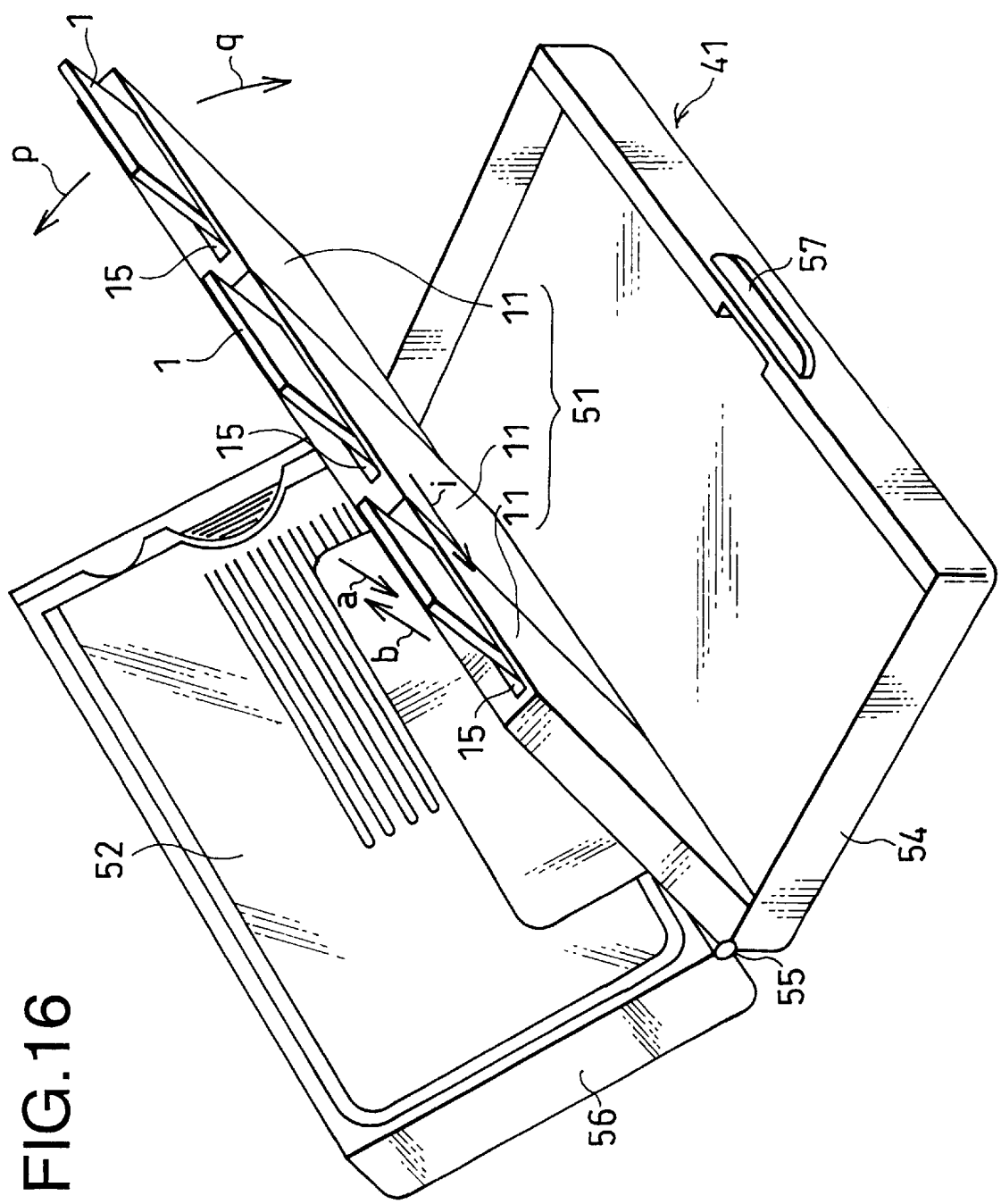
FIG. 16 is a perspective view for explaining insertion and ejection of the card type recording medium to and from the second embodiment of the container case holder of FIG. 15.

Next a second embodiment of a container case holder is explained with reference to FIG. 15 and FIG. 16. This container case holder 41 of this second embodiment has a business card sized container case connection member 51 carrying a plurality of the container case 11 as shown in FIG. 1 connected in the lateral direction. The container case connection member 51 is contained in a card sized card case 53 together with a business card 52 or the like as shown in FIG. 16. In this case, the card case 53 is constructed with a main body 54 and a case lid body 56 freely coupled by a hinge 55 in arrows p and q directions. In addition, the card case 53 contains the card 52 and the container case connection member 51 together with three card type recording medium 1 as shown in FIG. 16, and the case lid 56 is moved in the arrow q direction and closed on the main body 54. In this case the case lid 56 is locked on the main body 54 by a cover lock mechanism 57 as shown in FIG. 15, and accordingly the safety of the card case 53 is highly expected. According to the container case holder 41 of this second embodiment like the first embodiment, the mobility and the dust-tight nature to the plural (3 pieces, for example) container case 11 and the card type recording medium 1 are raised and a plurality of the card type recording medium 1 can be safely carried. When the card type recording medium 1 received in each container case 11 is taken out, the cover 43 is opened in arrows n and o directions as shown in FIG. 14. Then the card type recording medium 1 can be automatically pushed out in the arrow b direction from the container case 11 with a pop-up motion by slightly pushing the end edge 1e of the card type recording medium 1 to the arrow i direction as mentioned before.

Figure 17:
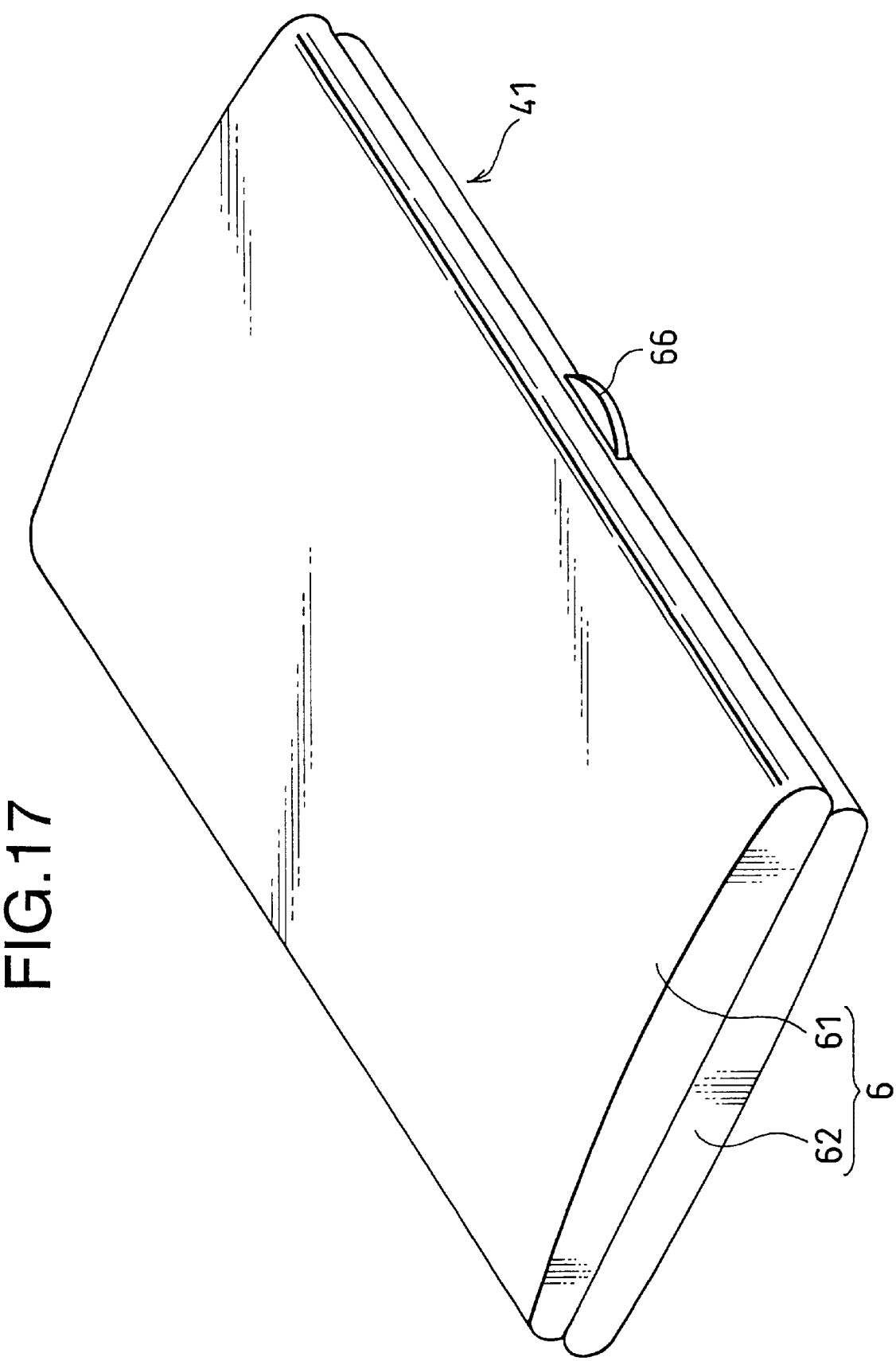
FIG. 17 is a perspective view for explaining a third embodiment of a container case holder for the card type recording medium.
Figure 18:
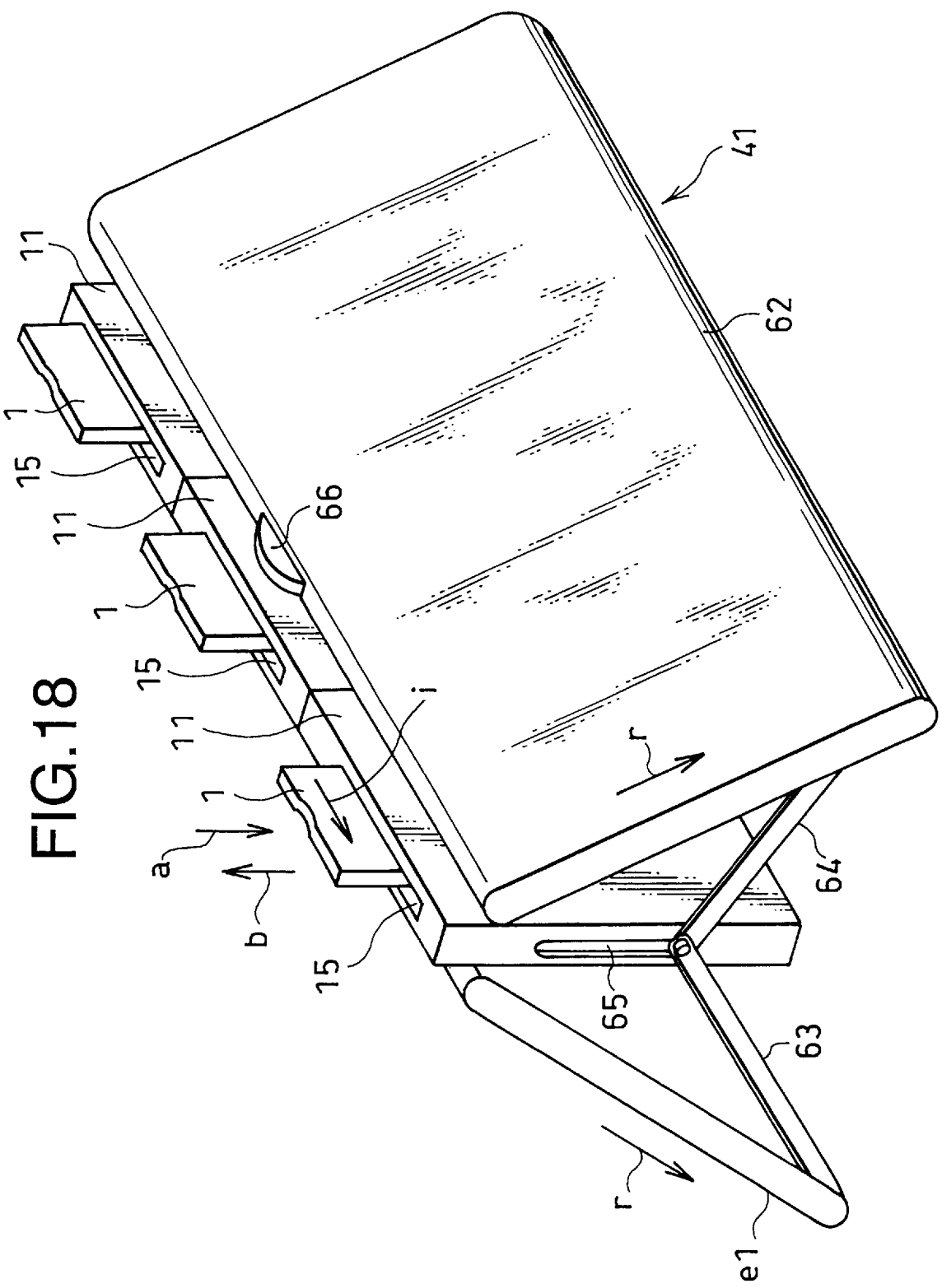
FIG. 18 is a perspective view for explaining insertion and ejection of the card type recording medium to and from the third embodiment of the container case holder of FIG. 17.

Next a third embodiment of a container case holder is explained with reference to FIG. 17 and FIG. 18. This container case holder 41 of the third embodiment is constructed to have a pair of covers 61 and 62 at top and bottom of the card sized container case connection member 51 which is formed by connecting three of the container case 11 in FIG. 1 in the lateral direction, wherein the covers 61 and 62 are movably attached and when the covers 61 and 62 are opened, these are used as a holding stand as shown in FIG. 18. Accordingly the covers 61 and 62 have arms 63 and 64, and respective tips of the arms 63 and 64 is slidably and rotatably engaged with guide grooves 65 formed on both sides of the container case connection member 51. And as shown in FIG. 18, the pair of covers 61 and 62 can be opened in an arrow r direction in a form of a wedge, and the covers 61 and 62 function as the holding stand in this condition to hold the container case connection member 51 in an upright condition. And after the card type recording medium 1 is stored by inserting in the arrow a direction from the inserting entrance 15 of the container case 11, the pair of covers 61 and 62 are closed in an arrow s direction, thereby the end edges 1e and the inserting entrances 15 of the received three card type recording medium 1 are simultaneously closed and then locked by a cover lock mechanism 66. Accordingly the three container cases 11 and the three card type recording medium 1 are sealed in the container case holder 41 in order to carry.

According to the container case holder 41 of this second embodiment like the first embodiment, the mobility and the dust-tight nature to the plural (3 pieces, for example) container case 11 and the card type recording medium 1 are raised and a plurality of the card type recording medium 1 can be safely carried. When the card type recording medium 1 received in each container case 11 is taken out, the cover 43 is opened in arrows n and o directions as shown in FIG. 14. Then the card type recording medium 1 can be automatically pushed out in the arrow b direction from the container case 11 with a pop-up motion by slightly pushing the end edge 1e of the card type recording medium 1 to the arrow i direction as mentioned before.

Figure 19:
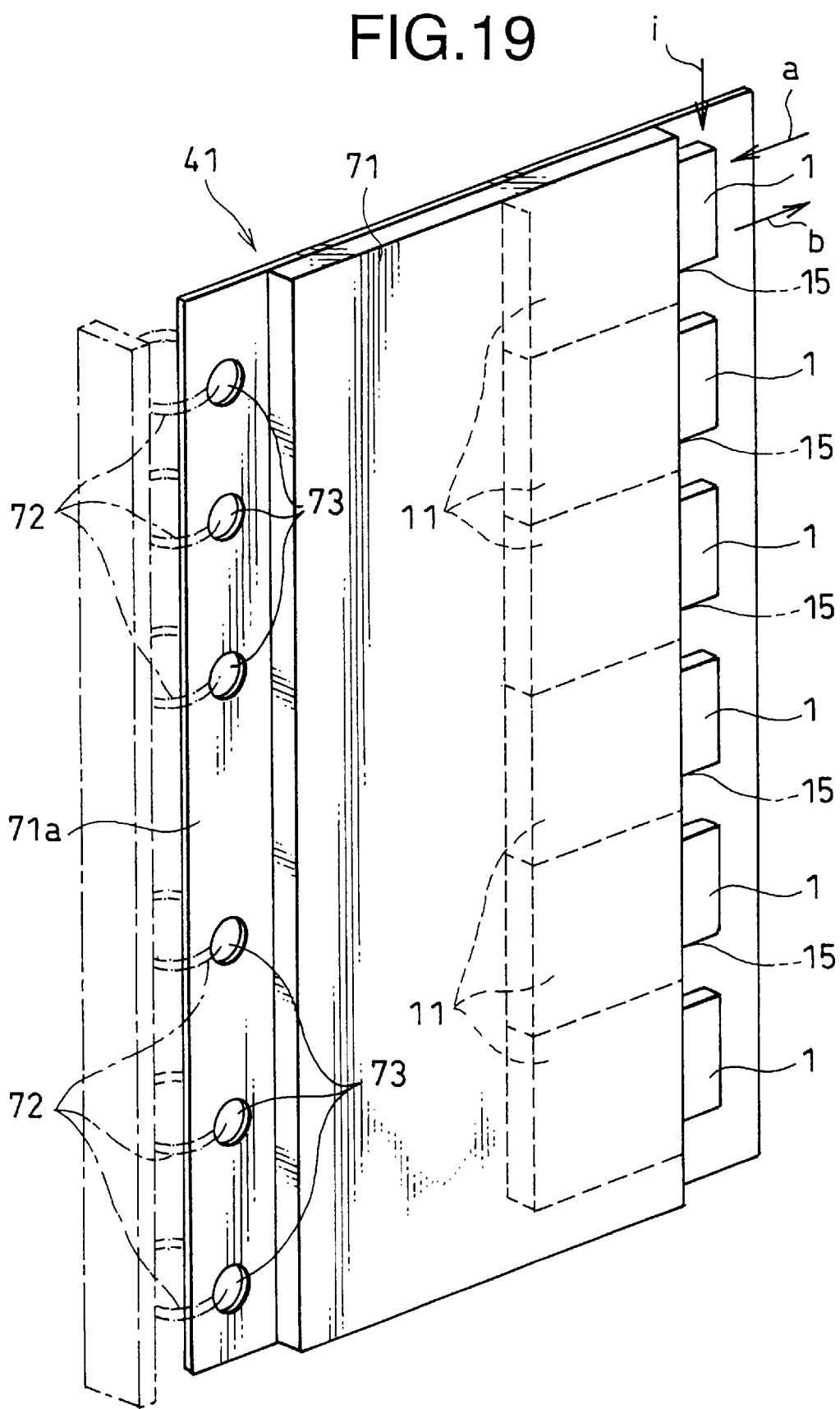
FIG. 19 is a perspective view for explaining a fourth embodiment of a container case holder.

Next a fourth embodiment of a container case holder is explained with reference to FIG. 19. A container case holder 41 of this embodiment stores for example, six of the container case 11 aligned in the lateral direction, and a plurality of engaging holes 73 for engaging with latches 72 of the system notebook are formed to be arranged in the lateral direction along with ends 71a of a holder 71, wherein the engaging holes 73 are formed on the holder 71 opposite to the inserting entrance 15 side of these container cases 11. of a holder 71, wherein the engaging holes 73 are formed on the holder 71 opposite to the inserting entrance 15 side of these container case 11.

Thus according to this container case holder 41, these six of the container case 11 are locked with latch 72 together with a refill of a system notebook by the holder 71, and the mobility is raised. And inserting and ejecting operation of the card type recording medium 1 to the container case 11 can be done easily as described before, and convenience of the container case 11 becomes good.

Figure 20:
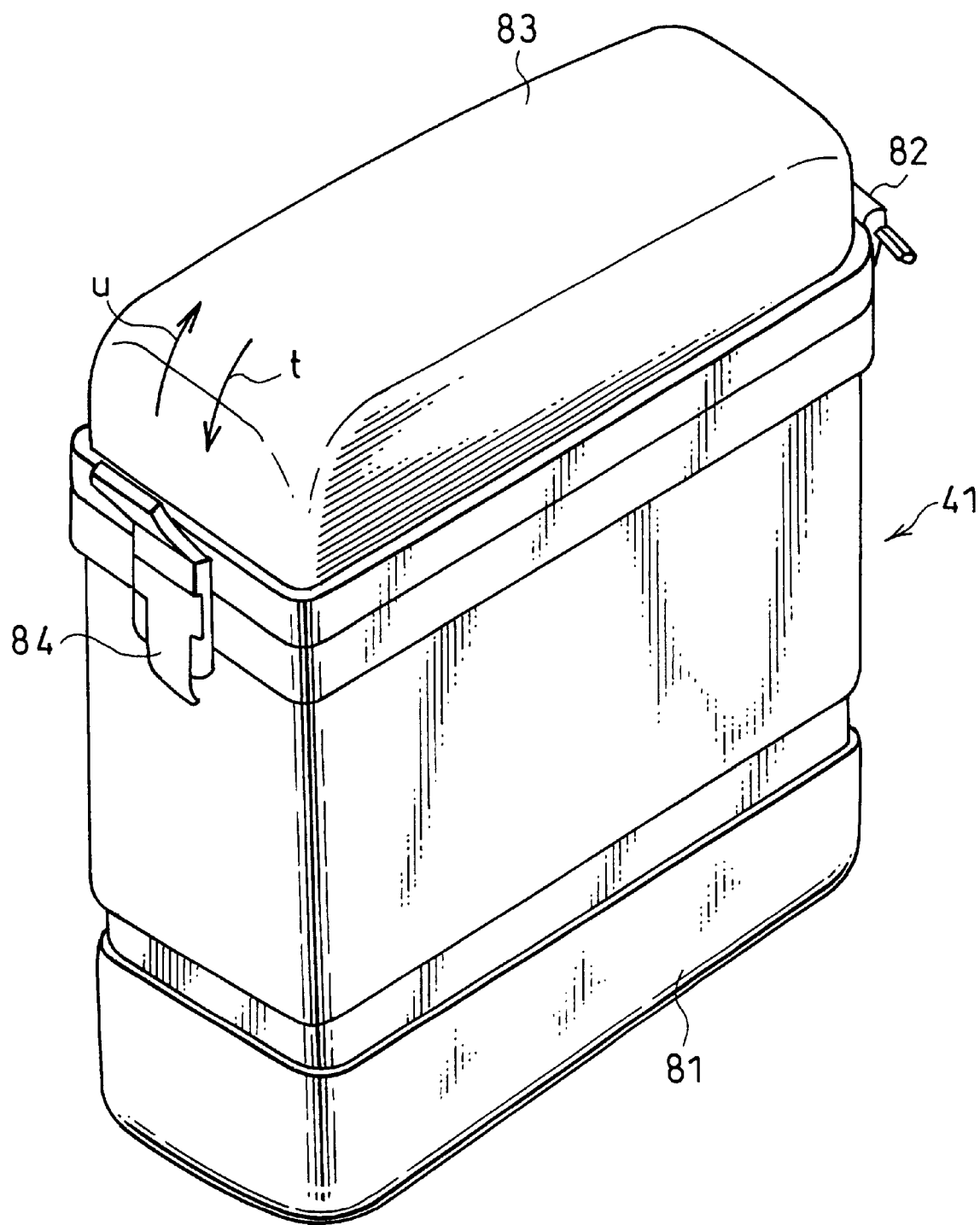
FIG. 20 is a perspective view for explaining a fifth embodiment of a container case holder.
Figure 21:
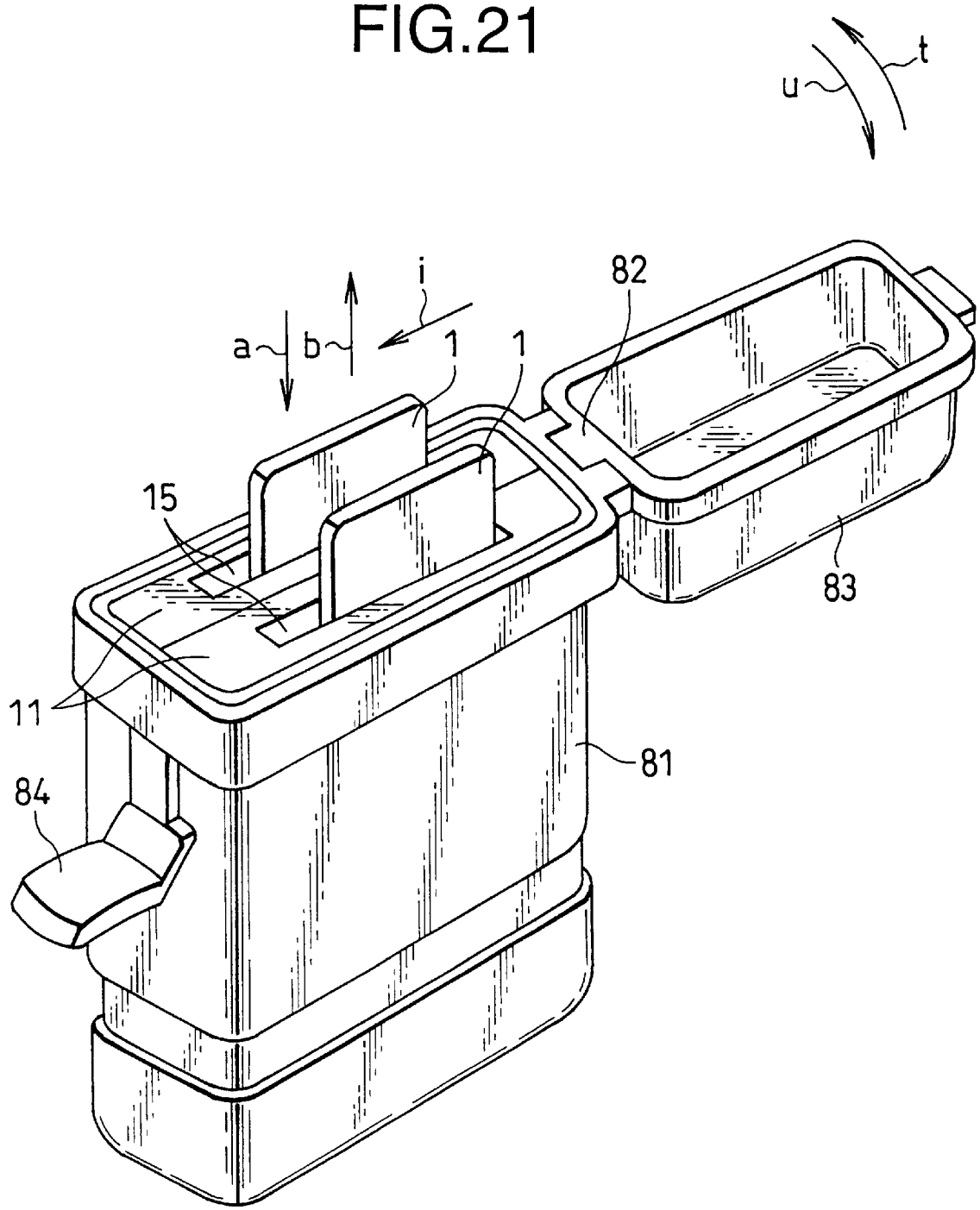
FIG. 21 is a perspective view for explaining insertion and ejection of the card type recording medium to and from the fifth embodiment of the container case holder in FIG. 20.

Next a fifth embodiment of a container case holder is explained with reference to FIG. 20 and FIG. 21. This container case holder 41 as shown in FIG. 21 for example, two container case 11 arranged in parallel in the inside of a holder main body 81 having cigarette lighter size. The two card type recording medium 1 are installed in the arrow a direction from the inserting entrance 15 of the upper end of the two container case 11. The container case holder 41 is constructed to be easily carried after sealing the rear end 1e of the two card type recording medium 1 stored in the pair container case 11 by a holder lid body 83, wherein the holder lid body 83 attached movably in arrows t and u directions by a hinge 82 in the upper end of a holder main body 81 is locked by a cover lock mechanism 84 after closing the holder lid body 83 in an arrow t direction as shown in FIG. 20. And as shown in FIG. 20, the card type recording medium 1 is stored by inserting in the arrow a direction from the inserting entrance 15 of the container case 11 after the holder lid body 83 is opened. The holder lid body 83 is closed after that in arrows k and m directions, thereby the end edges 1e and the inserting entrances 15 of the received three card type recording medium 1 are simultaneously closed by the holder lid body 83 in order to carry this container case holder 41.

According to this container case holder 41, the mobility and the dust-tight nature of the plural (2 pieces, for example) card type recording medium container case 11 and the card type recording medium 1 are high, and the plural card type recording medium 1 can be carried safely. When each card type recording medium 1 installed in each container case 11 is taken out, the rear end 1e of the card type recording medium 1 is only to be lightly pushed in an arrow i direction after opening the holder lid body 83 in an arrow u direction as shown in FIG. 21, then the card type recording medium 1 is able to be popped out automatically in an arrow b direction.

Figure 22:
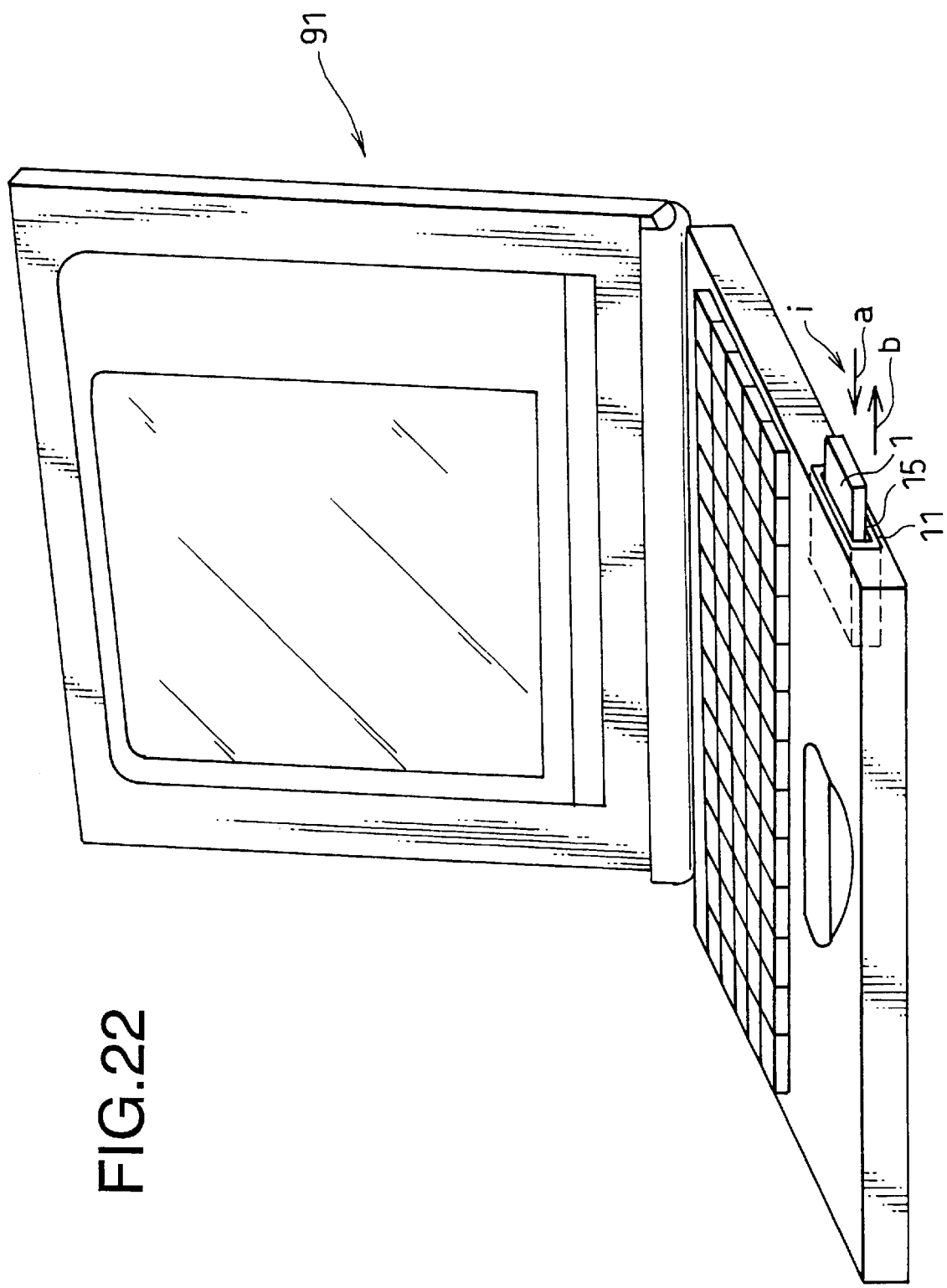
FIG. 22 is a perspective view for explaining one embodiment of an electronic device of the present invention equipped with a container case for the card type recording medium.

Next, an electronic device to which the container case is set is explained with reference to FIG. 22 and FIG. 23. In this embodiment, the container case 11 is provided in an electronic device 91 such as a personal computer, an electronic digital camera or the like. In the storage space 14 of the main body 12 of the container case 11, the plural connecting terminal 92 are set to face with the plural terminals 2 of the card type recording medium 1 at another side of the lid body 13, the fixed ends 92a of the connecting terminal 92 are soldered on the wiring pattern of the printed circuit board 93.

Figure 23:
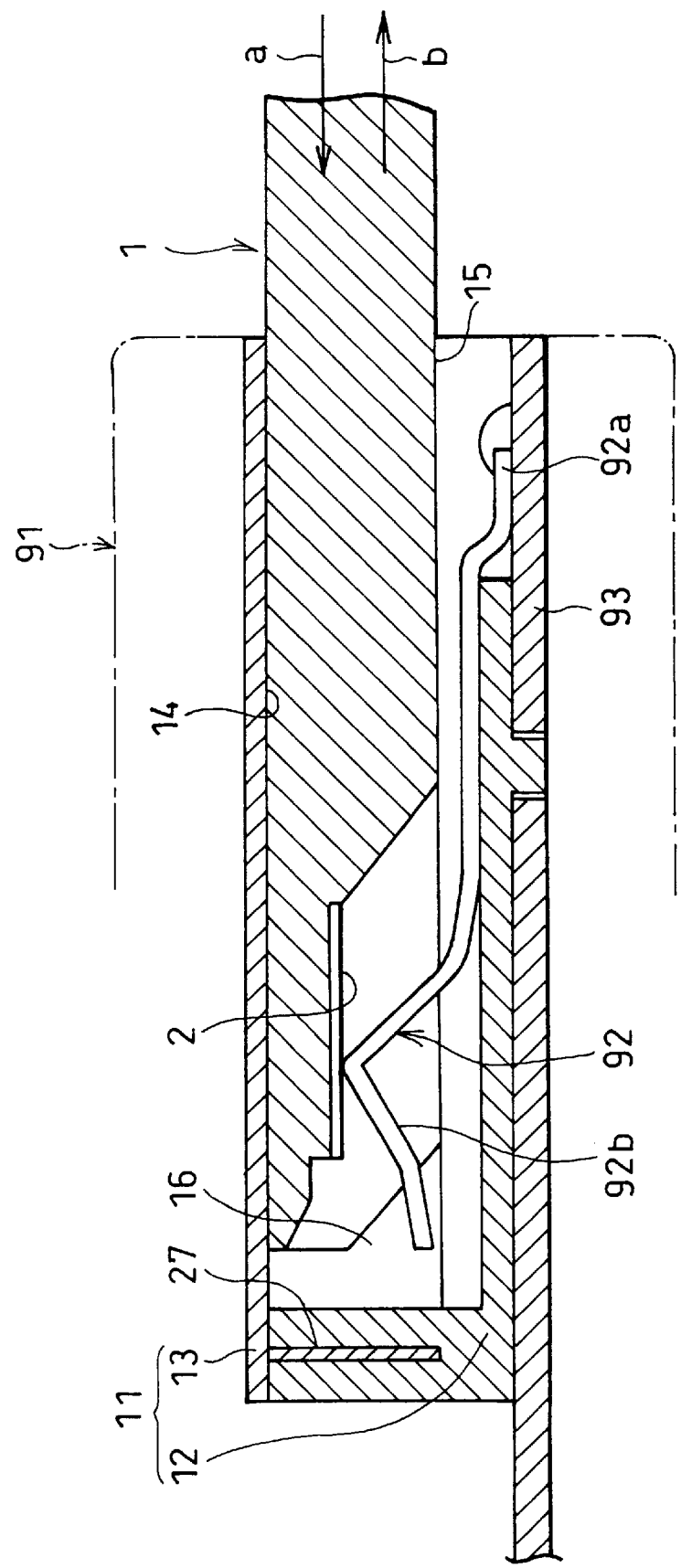
FIG. 23 is a sectional side view of a main part of the container case equipped in the electronic device in FIG. 22.
Figure 24:
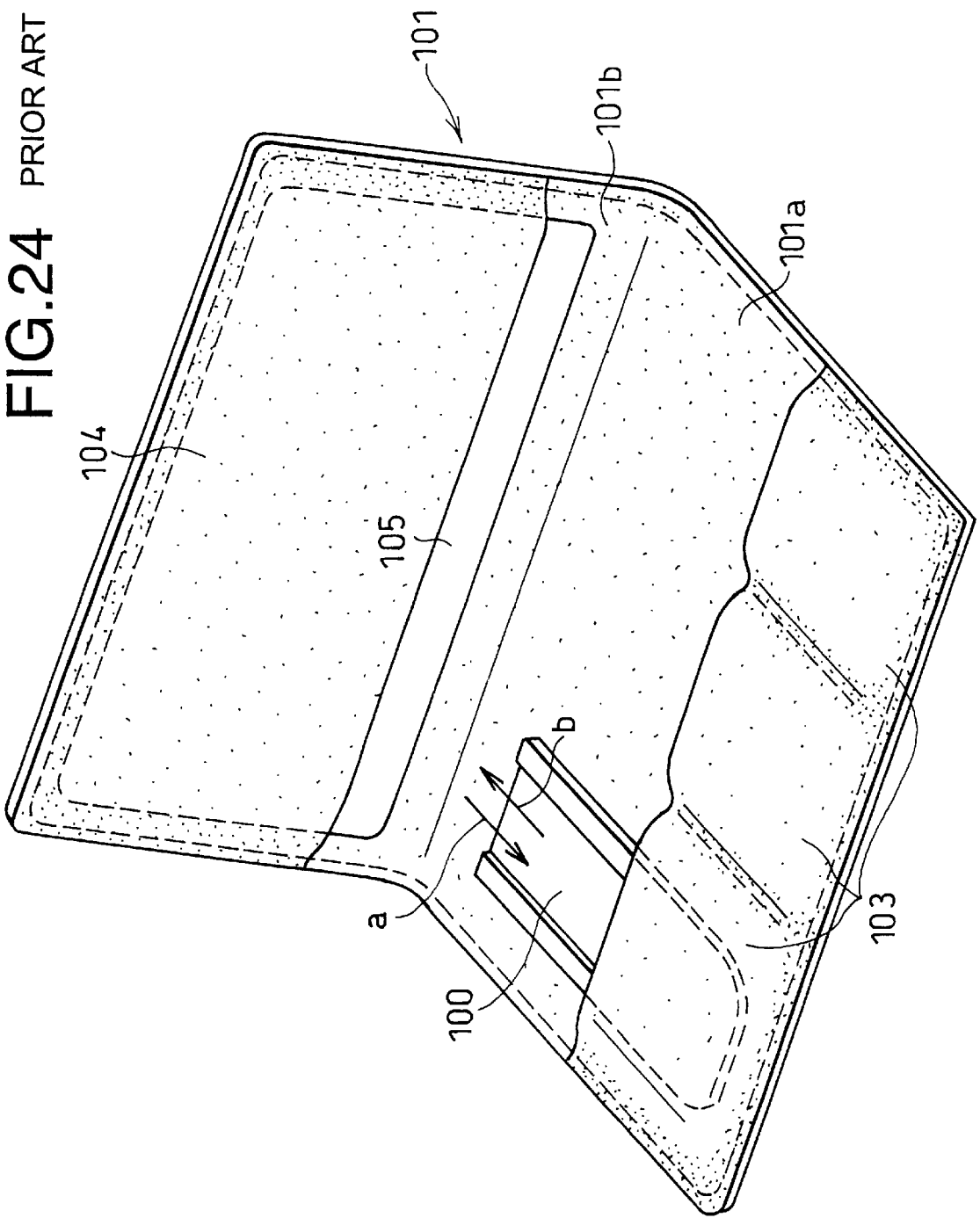
FIG. 24 is a perspective view for explaining one example of a conventional container case for the card type recording medium.
Figure 25:
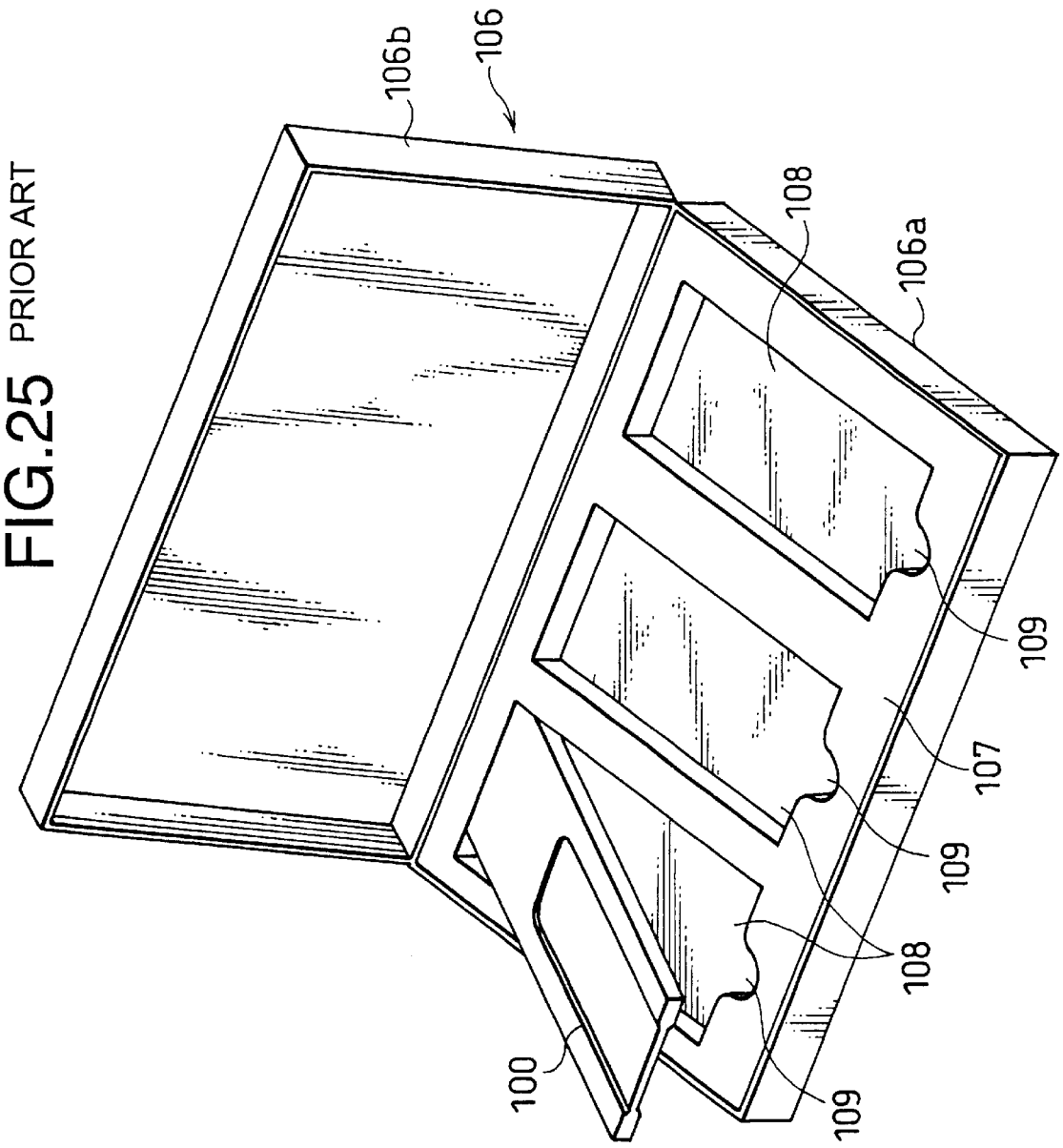
FIG. 25 is a perspective view for explaining another example of a conventional container case for a card type recording medium.

And as shown in FIG. 23, when the card type recording medium 1 is inserted into the storage space 14 through the inserting entrance 15 of the container case 11 from the leading edge 1a in the arrow a direction, the card type recording medium 1 is locked in the storage space 14 as mentioned above. Simultaneously the plural terminals 2 of the card type recording medium 1 are contacted with the moving end 92b of the plural connecting terminal 92 of the printed circuit board 93, and thereby this card type recording medium 1 is electrically connected to the electronic device 91. And this electronic device 91 is able to record or reproduce all kinds of data such as audio, video and text data to or from this card type recording medium 1. When the card type recording medium 1 is to be pulled out from the storage space 14 after recording and or reproducing of data, this card type recording medium 1 can be pop out into an arrow b direction automatically by lightly pushing the rear end part 1e of the card type recording medium 1 to an arrow i direction as shown in FIG. 22 as mentioned above.

According to the embodiment of this invention, the inserting, the locking, unlocking and the ejecting operation of the card type recording medium 1 to the electronic device 91 can be done simply and surely by one touch operation, and accordingly a convenience to such one touch operation can be obtained.

The above explanations are done with the embodiments of the invention with reference to the attached drawings, but the scope of the invention is not limited by the explanations, and all kinds of modification are possible within the scope of the present invention defined in the following claims.

What is claimed is:

1. A container case for a card type device comprising:
   a storage space having an inserting entrance for inserting a card type device;
   a resilient engaging means provided inside of said storage space on a first side thereof for engaging with a depression provided in a first side edge of said card type device;

a resilient ejecting means for ejecting said card type device out of said storage space by resilient power; and a rotation supporting means provided inside of said storage space which provides a fulcrum about which said card type device can be rotated in said storage space until said resilient engaging means disengages from said depression whereupon said resilient ejecting means ejects said card type device out of said storage space by resilient power.

2. The container case as recited in claim 1, further comprising:

a resilient pressing means provided at one side of said storage space opposite said resilient engaging means for resiliently pressing said card type device toward said resilient engaging means.

3. The container case as recited in claim 1, further comprising:

a main body having said storage space, said resilient engaging means, said resilient ejecting means and said rotation supporting means; and a case lid means provided at a front of said main body.

4. The container case as recited in claim 3 wherein said main body is formed by synthetic resin; and said resilient engaging means and said rotation supporting means are formed integrally with said main body by synthetic resin.

5. The container case as recited in claim 1, further comprising:

a connecting means on both sides of said container case for detachably connecting a plurality of said container cases in a lateral direction.

6. The container case as recited in claim 1, further comprising:

a connecting means on top and bottom sides of said container case for detachably connecting a plurality of said container cases in a stacking direction.

7. A container case for a card type device comprising:

a storage space having an inserting entrance for inserting a card type device;

a resilient engaging means provided inside of said storage space for engaging with said card type device;

a resilient ejecting means for ejecting said card type device out of said storage space by resilient power; and a rotation supporting means provided inside of said storage space which provides a fulcrum about which said card type device can be rotated in said storage space;

wherein said resilient ejecting means comprises:

a first resilient means to press said card type device toward said resilient engaging means; and a second resilient means to press said card type device toward an ejecting direction.

8. A container case holder for a card type device comprising:

a plurality of container cases each comprising:

a storage space having an inserting entrance for inserting a card type device;

a resilient engaging means provided inside of said storage space on a first side thereof for engaging with a depression provided in a first side edge of said card type device;

a resilient ejecting means for ejecting said card type device out of said storage space by resilient power; and a rotation supporting means provided inside of said storage space which provides a fulcrum about which said card type device can be rotated in said storage space until said resilient engaging means disengages from the depression whereupon said resilient ejecting means ejects the card type device out of said storage space by resilient power;

a main body for storing said plurality of said container cases in a lateral direction; and a cover fixed to said main body to close said main body.

9. A container case holder for a card type device comprising:

a plurality of container cases each comprising:

a storage space having an inserting entrance for inserting a card type device;

a resilient engaging means provided inside of said storage space on a first side thereof for engaging with a depression provided in a first side edge of said card type device;

a resilient ejecting means for ejecting said card type device out of said storage space by resilient power; and a rotation supporting means provided inside of said storage space which provides a fulcrum about which said card type device can be rotated in said storage space until said resilient engaging means disengages from the depression whereupon said resilient ejecting means ejects the card type device out of said storage space by resilient power;

a container case connecting means for connecting said plurality of said container cases together in the lateral direction; and a card case for containing said container case connecting means; wherein said card case is able to store a business card or the like.

10. A container case holder for a card type device comprising:

a plurality of container cases each comprising:

a storage space having an inserting entrance for inserting a card type device;

a resilient engaging means provided inside of said storage space on a first side thereof for engaging with a depression provided in a first side edge of said card type device;

a resilient ejecting means for ejecting said card type device out of said storage space by resilient power; and a rotation supporting means provided inside of said storage space which provides a fulcrum about which said card type device can be rotated in said storage space until said resilient engaging means disengages from the depression whereupon said resilient ejecting means ejects the card type device out of said storage space by resilient power;

a container case connecting means for storing said plurality of container cases in the lateral direction; and a pair of covers movably attached to both sides of said container case connecting means.

11. A container case holder for a card type device comprising:

a plurality of container cases each comprising:

a storage space having an inserting entrance for inserting a card type device;

a resilient engaging means provided inside of said storage space on a first side thereof for engaging with a depression provided in a first side edge of said card type device;

a resilient ejecting means for ejecting said card type device out of said storage space by resilient power; and a rotation supporting means provided inside of said storage space which provides a fulcrum about which said card type device can be rotated in said storage space until said resilient engaging means disengages from the depression whereupon said resilient ejecting means ejects the card type device out of said storage space by resilient power;

a holder for storing said plurality of container cases in the lateral direction; and a plurality of engaging holes provided on said holder.

12. A container case holder for a card type device comprising:

a plurality of container cases each comprising:

a storage space having an inserting entrance for inserting a card type device;

a resilient engaging means provided inside of said storage space on a first side thereof for engaging with a depression provided in a first side edge of said card type device;

a resilient ejecting means for ejecting said card type device out of said storage space by resilient power; and a rotation supporting means provided inside of said storage space which provides a fulcrum about which said card type device can be rotated in said storage space until said resilient engaging means disengages from the depression whereupon said resilient ejecting means ejects the card type device out of said storage space by resilient power;

a holder for storing said plurality of container cases in the stacked direction; and a cover movably attached to said holder.

13. An electronic device comprising:

a storage space having an inserting entrance for inserting a card type device;

a resilient engaging means provided inside of said storage space on a first side thereof for engaging with a depression provided in a first side edge of said card type device;

a resilient ejecting means for ejecting said card type device out of said storage space by resilient power; and a rotation supporting means provided inside of said storage space which provides a fulcrum about which said card type device can be rotated in said storage space until said resilient engaging means disengages from the depression whereupon said resilient ejecting means ejects the card type device out of said storage space by resilient power; and connecting terminals provided at a bottom of said storage space for electrically connecting to terminals of said card type device.

* * * * *